US012707628B2

(12) United States Patent
Karda et al.

(10) Patent No.: US 12,707,628 B2
(45) Date of Patent: Aug. 11, 2026

(54) MEMORY DEVICE HAVING 2-TRANSISTOR VERTICAL MEMORY CELL AND A COMMON PLATE

(71) Applicant: Micron Technology, Inc., Boise, ID (US)

(72) Inventors: Kamal M. Karda, Boise, ID (US); Karthik Sarpatwari, Boise, ID (US); Haitao Liu, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 523 days.

(21) Appl. No.: 18/141,046

(22) Filed: Apr. 28, 2023

(65) Prior Publication Data

US 2023/0269922 A1 Aug. 24, 2023

Related U.S. Application Data

(62) Division of application No. 17/003,037, filed on Aug. 26, 2020, now Pat. No. 11,665,880.

(Continued)

(51) Int. Cl.
*H10B 12/00* (2023.01)
*G11C 11/401* (2006.01)

(52) U.S. Cl.
CPC ............ *H10B 12/20* (2023.02); *G11C 11/401* (2013.01)

(58) Field of Classification Search
CPC .... H10D 30/689; H10D 30/63; H10D 30/711; H10D 62/86; H10D 30/6728;

(Continued)

(56) References Cited

U.S. PATENT DOCUMENTS

| | | | |
|---|---|---|---|
| 5,357,464 | A | 10/1994 | Shukuri et al. |
| 5,712,817 | A | 1/1998 | Suh |

(Continued)

FOREIGN PATENT DOCUMENTS

| | | | |
|---|---|---|---|
| CN | 109155312 | | 1/2019 |
| CN | 114365221 | A | 4/2022 |

(Continued)

OTHER PUBLICATIONS

"International Application Serial No. PCT/US2020/048004, International Preliminary Report on Patentability mailed Mar. 10, 2022", 8 pgs.

(Continued)

*Primary Examiner* — Edward Chin

(74) *Attorney, Agent, or Firm* — Schwegman Lundberg & Woessner, P.A.

(57) ABSTRACT

Some embodiments include apparatuses and methods of forming the apparatuses. One of the apparatuses includes a substrate, a conductive plate located over the substrate to couple a ground connection, a data line located between the substrate and the conductive plate, a memory cell, and a conductive line. The memory cell includes a first transistor and a second transistor. The first transistor includes a first region electrically coupled between the data line and the conductive plate, and a charge storage structure electrically separated from the first region. The second transistor includes a second region electrically coupled to the charge storage structure and the data line. The conductive line is electrically separated from the first and second regions and spans across part of the first region of the first transistor and part of the second region of the second transistor and forming a gate of the first and second transistors.

20 Claims, 24 Drawing Sheets

Related U.S. Application Data

(60) Provisional application No. 62/892,988, filed on Aug. 28, 2019.

(58) Field of Classification Search
CPC .... H10D 30/675; H10D 30/693; H10D 62/80; H10D 30/681
See application file for complete search history.

(56) References Cited

U.S. PATENT DOCUMENTS

| | | | | |
|---|---|---|---|---|
| 9,230,985 | B1 | 1/2016 | Wu et al. | |
| 10,079,301 | B2 | 9/2018 | Han et al. | |
| 10,763,273 | B2 * | 9/2020 | Wu | G11C 16/0433 |
| 2005/0269628 | A1 | 12/2005 | King | |
| 2011/0002159 | A1 | 1/2011 | Suzuki et al. | |
| 2011/0007578 | A1 | 1/2011 | Luthra et al. | |
| 2012/0307568 | A1 | 12/2012 | Banna et al. | |
| 2018/0122943 | A1 | 5/2018 | Han et al. | |
| 2019/0326296 | A1 * | 10/2019 | Wang | H10B 12/50 |
| 2021/0066301 | A1 | 3/2021 | Karda et al. | |

FOREIGN PATENT DOCUMENTS

| | | | |
|---|---|---|---|
| JP | H05110016 | A | 4/1993 |
| TW | 201349502 | A | 12/2013 |
| TW | 202123426 | A | 6/2021 |
| WO | WO-2019066927 | A1 | 4/2019 |
| WO | WO-2021041547 | A1 | 3/2021 |

OTHER PUBLICATIONS

"International Application Serial No. PCT/US2020/048004, International Search Report mailed Dec. 2, 2020", 3 pgs.
"International Application Serial No. PCT/US2020/048004, Written Opinion mailed Dec. 2, 2020", 6 pgs.
"Taiwanese Application Serial No. 109129637, Response filed Jan. 14, 2021 to Taiwanese Office Action mailed Apr. 13, 2021", w/ English Claims, 67 pgs.
"Taiwanese Application Serial No. 109129637, Taiwanese Office Action mailed Apr. 13, 2021", w/ English Translation, 19 pgs.
"Chinese Application Serial No. 202080060550.6, Office Action mailed May 21, 2025", with English translation, 18 pages.
"Chinese Application Serial No. 202080060550.6, Response filed Sep. 22, 2025 to Office Action mailed May 21, 2025", w/ English Claims, 80 pgs.

* cited by examiner

MEMORY DEVICE HAVING 2-TRANSISTOR VERTICAL MEMORY CELL AND A COMMON PLATE

PRIORITY APPLICATION

This application is a divisional of U.S. application Ser. No. 17/003,037, filed Aug. 26, 2020, which claims the benefit of priority to U.S. Provisional Application Ser. No. 62/892,988, filed Aug. 28, 2019, all of which are incorporated herein by reference in their entirety.

BACKGROUND

Memory devices are widely used in computers and many other electronic items to store information. Memory devices are generally categorized into two types: volatile memory devices and non-volatile memory devices. A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. The described memory device can include a single access line (e.g., word line) to control two transistors of a memory cell. This can lead to reduced power dissipation and improved processing. Each of the memory cells of the described memory device can include a cross-point gain cell structure (and cross-point operation), such that a memory cell can be accessed using a single access line (e.g., word line) and single data line (e.g., bit line) during an operation (e.g., a read or write operation) of the memory device. Other improvements and benefits of the described memory device and its variations are discussed below with reference to FIG. 1 through FIG. 27C.

Figure 1:
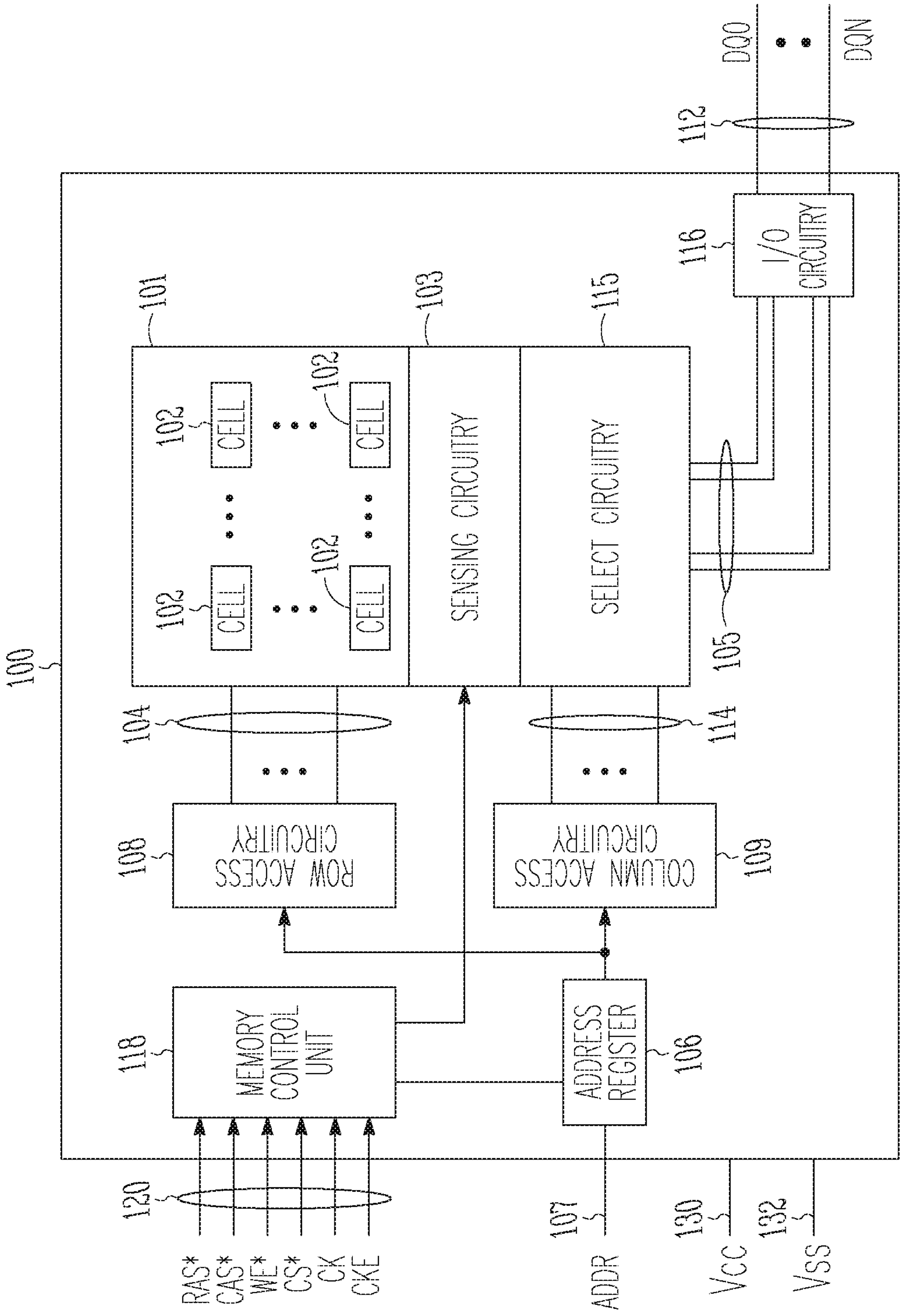
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 27C.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102 and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 2 through FIG. 27C.

Figure 2:
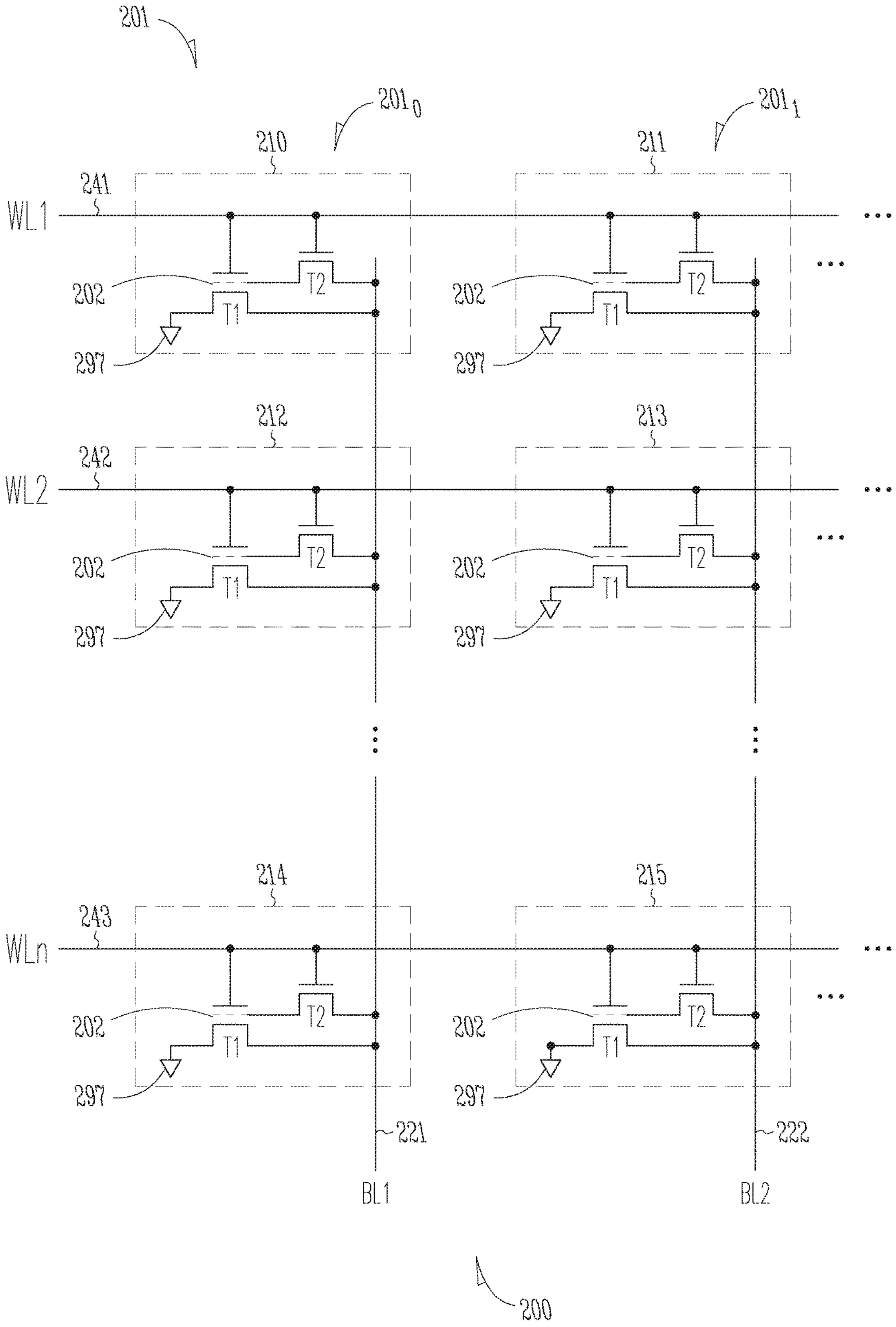
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201 of 2T memory cells, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor FET (PFET). Thus, transistor T1 can include an operation similar to that of a PMOS transistor. Part of transistor T2 can include a structure of an n-channel metal-oxide semiconductor (NMOS). Thus, transistor T2 can include an operation similar to that of a NMOS transistor.

Transistor T1 of memory device 200 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200.

Memory cells 210 through 215 can be arranged in memory cell groups $\mathbf{201_0}$ and $\mathbf{201_1}$. FIG. 2 shows two memory cell groups (e.g., $\mathbf{201_0}$ and $\mathbf{201_1}$) as an example. However, memory device 200 can include more than two memory cell groups. Memory cell groups $\mathbf{201_0}$ and $\mathbf{201_1}$ can include the same number of memory cells. For example, memory cell group $\mathbf{201_0}$ can include memory cells 210, 212, and 214, and memory cell group $\mathbf{201_1}$ can include memory cells 211, 213, and 215. FIG. 2 shows three memory cells in each of memory cell groups $\mathbf{201_0}$ and $\mathbf{201_1}$ as an example. The number of memory cells in memory cell groups $\mathbf{201_0}$ and $\mathbf{201_1}$ can be different from three.

Memory device 200 can perform a write operation to store information in memory cells 210 through 215 and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $\mathbf{201}_0$ and $\mathbf{201}_1$. Each of access lines 241, 242, and 243 can be structured as at least one conductive line (one conductive line or multiple conductive lines that can be electrically coupled (e.g., shorted) to each other). Access lines 241, 242, and 243 can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200. Further, some conventional memory devices may use multiple data lines to access a selected memory cell (e.g., during a read operation) to read information from the selected memory cell. In memory device 200, a single data line (e.g., data line 221 or 222) can be used to access a selected memory cell (e.g., during a read operation) to read information from the selected memory cell. This may also simplify the structure, operation, or both of memory device 200 in comparison with conventional memory devices use multiple data lines to access a selected memory cell.

In memory device 200, the gate of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241. For example, in the structure of memory device 200, four different portions of a conductive material (or materials) that form access line 241 can form the gates (e.g., four gates) of transistors T1 and T2 of memory cell 210 and the gates transistors T1 and T2 of memory cell 211, respectively.

The gate of each of transistors T1 and T2 of memory cell 212 can be part of access line 242. The gate of each of transistors T1 and T2 of memory cells 213 can be part of access line 242. For example, in the structure of memory device 200, four different portions of a conductive material (or materials) that form access line 242 can form the gates (e.g., four gates) of transistors T1 and T2 of memory cell 212 and the gates transistors T1 and T2 of memory cell 213, respectively.

The gate of each of transistors T1 and T2 of memory cell 214 can be part of access line 243. The gate of each of transistors T1 and T2 of memory cell 215 can be part of access line 243. For example, in the structure of memory device 200, four different portions of a conductive material (or materials) that form access line 243 can form the gates (e.g., four gates) of transistors T1 and T2 of memory cell 214 and the gates transistors T1 and T2 of memory cell 215, respectively.

Memory device 200 can include data lines (e.g., bit lines) 221 and 222 that can carry respective signals (e.g., bit line signals) BL1 and BL2. During a read operation, memory device 200 can use data line 221 to obtain information read (e.g., sense) from a selected memory cell of memory cell group $\mathbf{201}_0$, and data line 222 to read information from a selected memory cell of memory cell group $\mathbf{201}_1$. During a write operation, memory device 200 can use data line 221 to provide information to be stored in a selected memory cell of memory cell group $\mathbf{201}_0$, and data line 222 to provide information to be stored in a selected memory cell of memory cell group $\mathbf{201}_1$.

Memory device 200 can include a ground connection (e.g., ground plate) 297 coupled to each of memory cells 210 through 215. Ground connection 297 can be structured from a conductive plate (e.g., a layer of conductive material) that can be coupled to ground terminal of memory device 200. As an example, ground connection 297 can be a common conductive plate (e.g., formed over the memory cells (e.g., memory cells 210 through 215) of memory device 200. In this example, the common conductive plate can be formed over the elements (e.g., transistors T1 and T2) of each of the memory cells (e.g., memory cells 210 through 215) of memory device 200.

As shown in FIG. 2, transistor T1 (e.g., the channel region of transistor T1) of a particular memory cell among memory cells 210 through 215 can be electrically coupled to (e.g., directly coupled to) ground connection 297 and electrically coupled to (e.g., directly coupled to) a respective data line (e.g., data line 221 or 222). Thus, a circuit path (e.g., current path) can be formed between a respective data line (e.g., data line 221 or 222) and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $\mathbf{201}_0$, a read path of a particular memory cell (e.g., memory cell 210, 212, or 214) can include a current path (e.g., read current path) through a channel region of transistor T1 of that particular memory cell, data line 221, and ground connection 297. In memory cell group $\mathbf{201}_1$, a read path of a particular memory cell (e.g., memory cell 211, 213, or 215) can include a current path (e.g., read current path) through a channel region of transistor T1 of that particular memory cell, data line 222, and ground connection 297. In the example where transistor T1 is a PFET (e.g., a PMOS), the current in the read path (e.g., during a read operation) can include a hole conduction (e.g., hole conduction in the direction from data line 221 to ground connection 297 through the channel region of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $\mathbf{201}_0$, a write path of a particular memory cell can include transistor T2 (e.g., can include a write current path through a channel region of transistor T2) of that particular memory cell and data line 221. In memory cell group $\mathbf{201}_1$, a write path of a particular memory cell (e.g., memory cell 211, 213, or 215) can include transistor T2 (e.g., can include a write current path through a channel region of transistor T2) of that particular memory cell and data line 222. In the example where transistor T2 is an NFET (e.g., NMOS), the current in a write path (e.g., during a write operation) can include an electron conduction (e.g., electron conduction in the direction from data line 221 to charge storage structure 202 through the channel region of transistor T2. Since transistor T2 can be used in a write path to store information in a respective memory cell during a write operation, transistor T2 can be called a write transistor and the channel region of transistor T1 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows, Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1," where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 (for state "0")<Vt1 (for state "1"), where Vt1 for state "0"=0V (or alternatively Vt1 for state "0">0V), and Vt1<Vt2.

During a read operation of memory device 200, only one memory cell of the same memory cell group can be selected at a time to read information from the selected memory cell. For example, memory cells 210, 212, and 214 of memory cell group $\mathbf{201}_0$ can be selected one at a time during a read operation to read information from the selected memory cell (e.g., one of memory cells 210, 212, and 214 in this example). In another example, memory cells 211, 213, and 215 of memory cell group $\mathbf{201}_1$ can be selected one at a time during a read operation to read information from the selected memory cell (e.g., one of memory cells 211, 213, and 215 in this example).

During a read operation, memory cells of different memory cell groups (e.g., memory cell groups $\mathbf{201}_0$ and $\mathbf{201}_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $\mathbf{201}_0$ during a read operation can be determined based on the value of a current detected (e.g. sensed) from a read path (described above) that includes data line 221, transistor T1 of the selected memory cell (e.g., memory cell 210, 212, or 214), and ground connection 297. The value of information read from the selected memory cell of memory cell group $\mathbf{201}_1$ during a read operation can be determined based on the value of a current detected (e.g. sensed) from a read path that includes data line 222, transistor T1 of the selected memory cell (e.g., memory cell 211, 213, or 215), and ground connection 297.

Memory device 200 can include detection circuitry (not shown) that can operate during a read operation to detect (e.g., sense) a current (e.g., current I1, not shown) on a read path that includes data line 221 and detect a current (e.g., current I2, not shown) on a read path that includes data line 222. The value of the detected current can be based on the value of information stored in the selected memory cell. For example, depending on the value of information stored in the selected memory cell of memory cell group $\mathbf{201}_0$, the value of the detected current (e.g., the value of current I1) on data line 221 can be zero or greater than zero. Similarly, depending on the value of information stored in the selected memory cell of memory cell group $\mathbf{201}_1$, the value of the detected current (e.g., the value of current I2) on data line 222 can be zero or greater than zero. Memory device 200 can include circuitry (not shown) to translate the value of a detected current into the value (e.g., "0," "1," or a combination of multi-bit values) of information stored in the selected memory cell.

During a write operation of memory device 200, only one memory cell of the same memory cell group can be selected at a time to store information in the selected memory cell. For example, memory cell 210, 212, and 214 of memory cell group $\mathbf{201}_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 221 and transistor T2 of the selected memory cell (e.g., memory cell 210, 212, or 214). Information to be stored in a selected memory cell of memory cell group $201_1$ during a write operation can be provided through a write path (described above) that includes data line 222 and transistor T2 of the selected memory cell (e.g., memory cell 212, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 221 or 222) coupled to that particular memory cell. For example, a voltage having one value (e.g., 0V) can be applied on data line 221 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Figure 3:
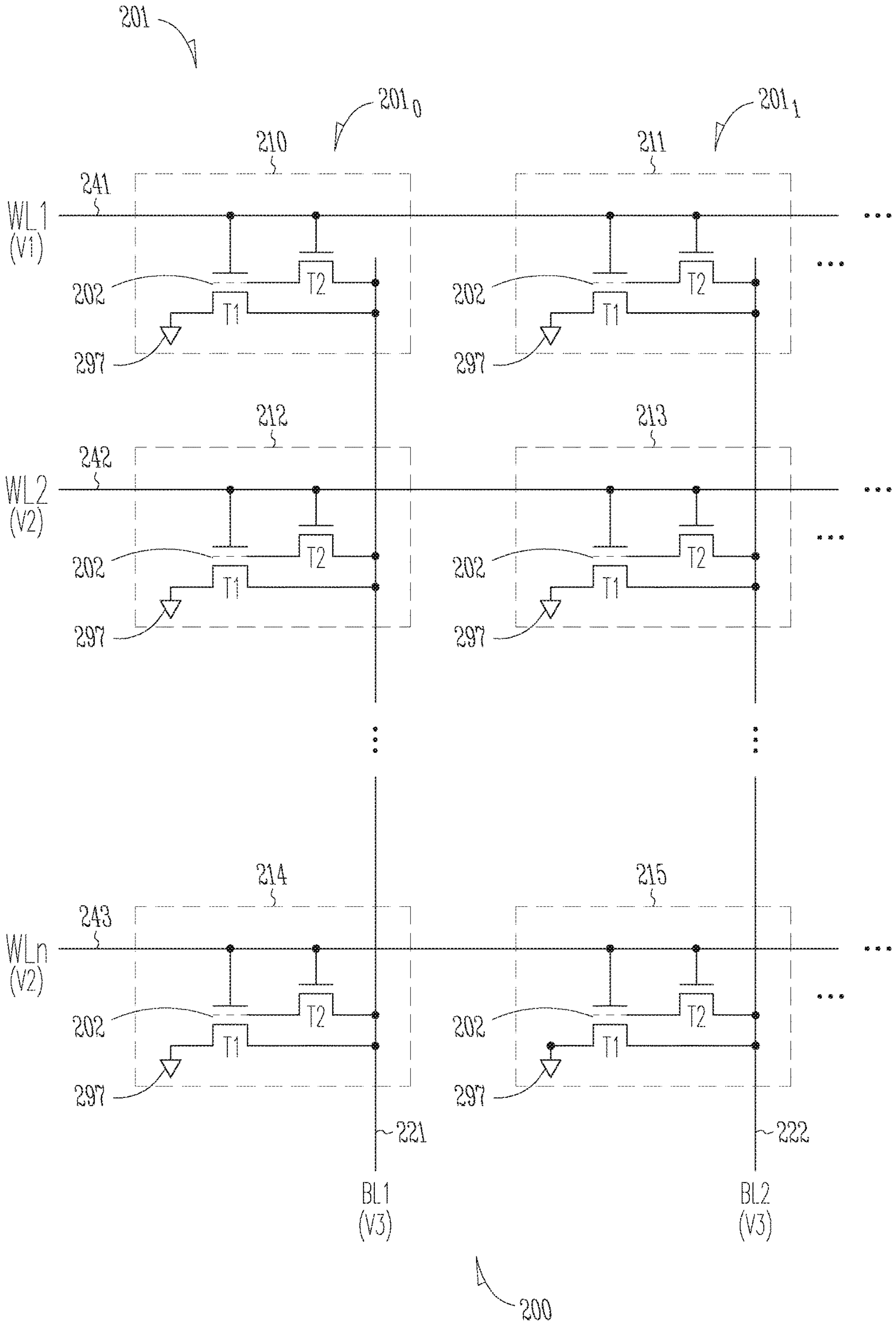
FIG. 3 shows the memory device of FIG. 2, including example voltages used during a read operation of the memory device, according to some embodiments described herein.

FIG. 3 shows memory device 200 of FIG. 2 including example voltages V1, V2, and V3 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed and information stored in memory cells 212 through 215 are not read while information is read from memory cells 210 and 211 in the example of FIG. 3.

In FIG. 3, voltages V1, V2, and V3 can represent different voltages applied to respective access lines 241, 242, and 243, and data lines 221 and 222 during a read operation of memory device 200. As an example, voltages V1, V2, and V3 can have values −1V, 0V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value, such that transistors T1 and T2 of each of memory cells 212 through 215 (unselected memory cells in this example) are turned off (e.g., kept off). Voltage V3 can have a value, such that a current (e.g., read current) may be formed on a read path that includes data line 221 and transistor T1 of memory cell 210, and a read path (a separate read path) that includes data line 222 and transistor T1 of memory cell 212. This allows a detection of current on the read paths coupled to memory cells 210 and 211, respectively. A detection circuitry (not shown) of memory device 200 can operate to translate the value of the detected current (during reading of information from the selected memory cells) into the value (e.g., "0," "1," or a combination of multi-bit values) of information read from the selected memory cell. In the example of FIG. 3, the value of the detected currents on data lines 221 and 222 can be translated into the values of information read from memory cells 210 and 211, respectively.

In the read operation shown in FIG. 3, the voltages applied to respective access lines 241, 242, and 243 can cause transistors T1 and T2 of each of memory cells 212 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 221 (through transistor T1 of memory cell 210). In this example, transistor T1 of memory cell 211 can also turn on and conduct a current on data line 222 (through transistor T1 of memory cell 211). Memory device 200 can determine the value of information stored in memory cells 210 and 211 based on the value of the currents on data lines 221 and 222, respectively. As described above, memory device 200 can include detection circuitry to measure the value of currents on data lines 221 and 222 during a read operation.

Figure 4:
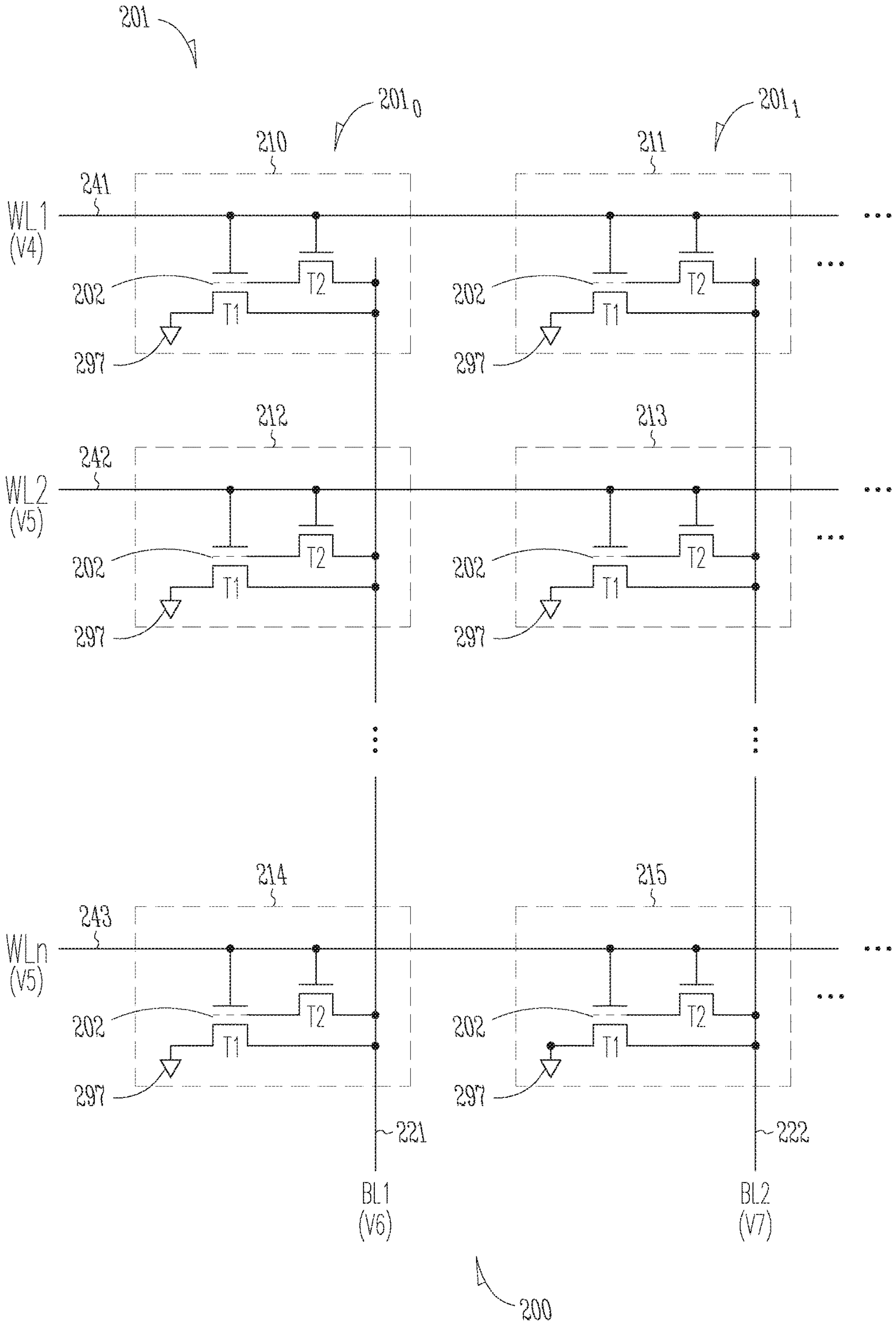
FIG. 4 shows the memory device of FIG. 2, including example voltages used during a write operation of the memory device, according to some embodiments described herein.

FIG. 4 shows memory device 200 of FIG. 2 including example voltages V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 4.

In FIG. 4, voltages V4, V5, V6, and V7 can represent different voltages applied to respective access lines 241, 242, and 243, and data lines 221 and 222 during a write operation of memory device 200. As an example, voltages V4 and V5 can have values of 3V and 0V, respectively. These values are example values. Different values may be used.

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0", and V6=V7=1V to 3V if information to be stored in each memory cell 210 and 211 is "1").

In another example, the values of voltages V6 and V7 can be different (e.g., V6≠V7) if the memory cells 210 and 211 are to store information having different values. As an example, V6=0V and V7=1V to 3V if "0" to be stored in memory cell 210 and "1" is to be stored in memory cell 211). As another example, V6=1V to 3V and V7=0V if "1" is to be stored in memory cell 210 and "0" is to be stored in memory cell 211).

The range of voltage of 1V to 3V is used here as an example. A different range of voltages can be used. Further, instead of applying 0V (e.g., V6=0V or V7=0V) to a particular write data line (e.g., data line 221 or 222) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 4, voltage V5 can have a value, such that transistors T1 and T2 of each of memory cells 212 through 215 (unselected memory cells, in this example) are turned off (e.g., kept off). Voltage V4 can have a value to turn on transistor T2 of each of memory cells 210 and 211 (selected memory cells in this example) and form a write path between charge storage structure 202 of memory cell 210 and data line 221, and a write path between charge storage structure 202 of memory cell 211 and data line 222. A current (e.g., write current) may be formed between charge storage structure 202 of memory cell 210 (selected memory cell) and data line 221. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 222. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

Figure 6:
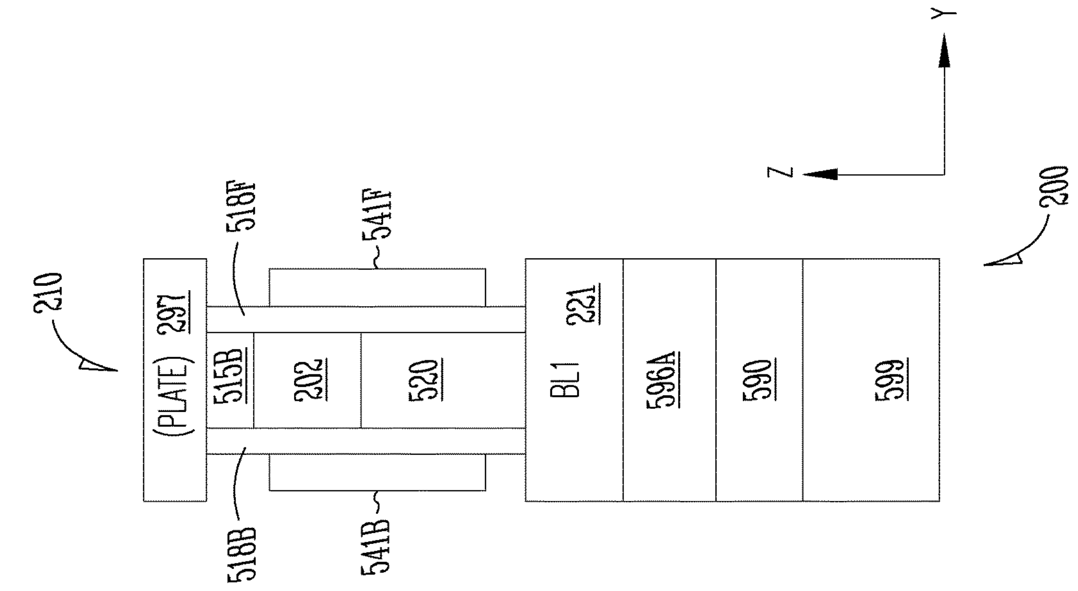
FIG. 5 and FIG. 6 show different views of a structure of the memory device of FIG. 2, according to some embodiments described herein.
Figure 5:
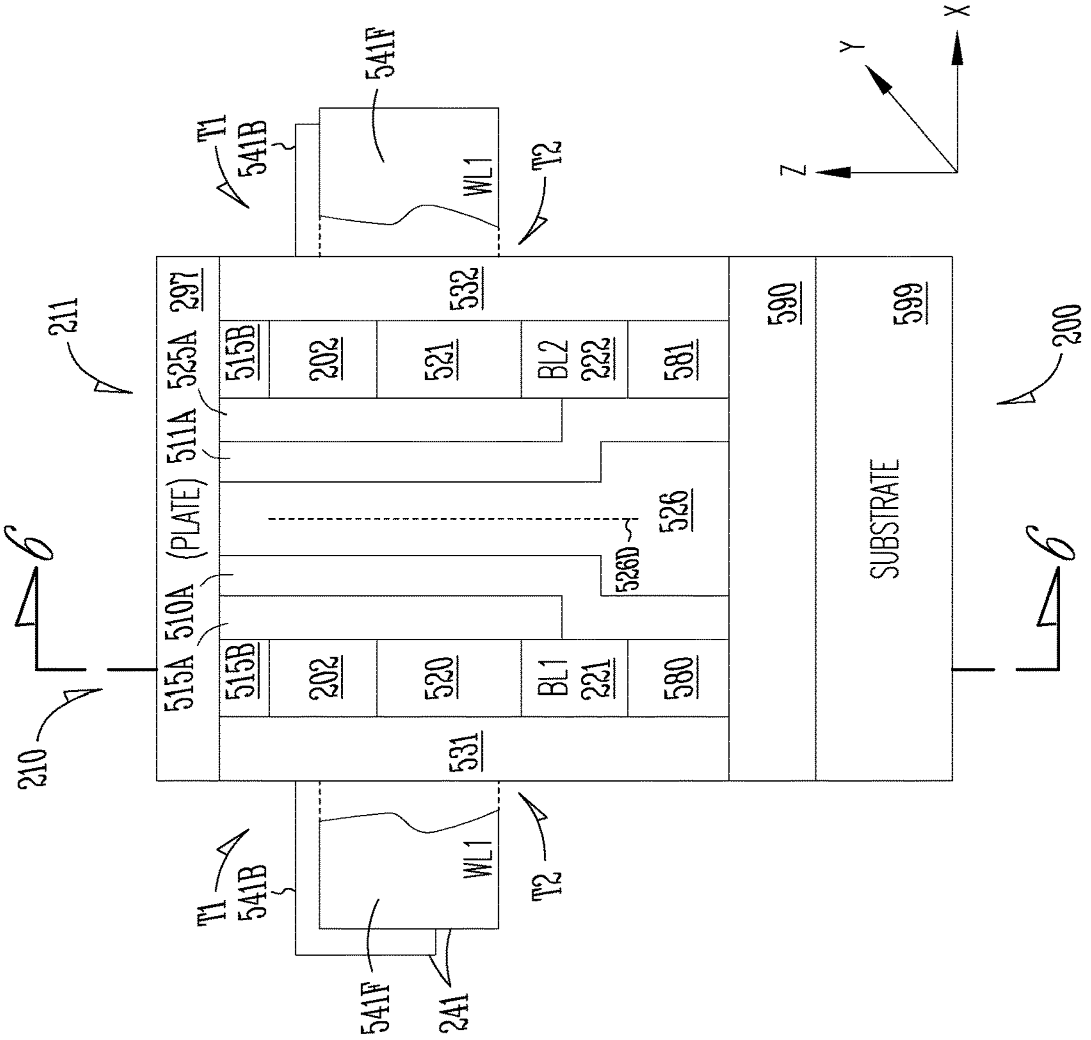

FIG. 5 and FIG. 6 show different views of a structure of memory device 200 of FIG. 2 with respect to the X, Y, and Z directions, according to some embodiments described herein. FIG. 5 shows a side view (e.g., cross-sectional views) of memory device 200 with respect to the X-Z direction. FIG. 6 shows a view (e.g., cross-sectional views) taken along lines 6-6 of FIG. 5.

For simplicity, FIG. 5 and FIG. 6 shows the structures of memory cell 210 and 211. The structures of other memory cells (e.g., memory cells 212 through 215) of memory device 200 of FIG. 2 can be similar to or identical to the structure of memory cells 210 and 211 shown in FIG. 5 and FIG. 6. In FIG. 2, FIG. 5, and FIG. 6, the same elements are given the same reference numbers.

The following description refers to FIG. 5 and FIG. 6. For simplicity, detailed description of the same element is not repeated in the description of FIG. 5 and FIG. 6. Also for simplicity, cross-sectional lines (e.g., hatch lines) are omitted from most of the elements shown in FIG. 5 and FIG. 6 and other figures (e.g., FIG. 7 through FIG. 27C) in the drawings described herein. Some elements of memory device 200 may be omitted from a particular figure of the drawings so as to not obscure the description of the element (or elements) being described in that particular figure. The dimensions (e.g., physical structures) of the elements shown in the drawings described herein are not scaled.

As shown in FIG. 5, memory device 200 can include a substrate 599 over which memory cells 210 and 211 (and other memory cells (not shown) of memory device 200) can be formed. Transistors T1 and T2 of each of memory cells 210 and 211 can be formed vertically with respect to substrate 599. Substrate 599 can be a semiconductor substrate (e.g., silicon-based substrate) or other types of substrates. The Z-direction (e.g., vertical direction) is a direction perpendicular to (e.g., outward from) substrate 599. The Z-direction is also perpendicular to (e.g., extended vertically from) an X-direction and a Y-direction. The X-direction and Y-direction are perpendicular to each other.

As shown in FIG. 5 and FIG. 6, ground connection 297 can include a structure (e.g., a piece (e.g., a layer)) of material located over the elements (described below) of memory cells 201 and 211 and over data lines 211 and 222. Example materials for ground connection 297 include a piece of metal, conductively doped polysilicon, or other conductive materials. Ground connection 297 can be coupled to a ground terminal (not shown) of memory device 200. Thus, as shown in FIG. 5, the elements of memory cells 210 and 211 and data lines 221 and 222 can be located (e.g., located in respective levels) between substrate 599 and the material (e.g., metal) that forms ground connection 297.

As shown in FIG. 5, memory device 200 can include a dielectric 590 formed over a portion of substrate 599. Dielectric 590 can include silicon oxide. Dielectric 590 can electrically separate the elements of memory cells 210 and 211 and data lines 221 and 222 from substrate 599.

As shown in FIG. 5 and FIG. 6, data line 221 (associated with signal BL1) can have a length (FIG. 6) in the Y-direction, a width (FIG. 5) in the X-direction, and a thickness (FIG. 5) in the Z-direction. Similarly, data line 222 (associated with signal BL2) can have a length (not shown in FIG. 6) in the Y-direction, a width (FIG. 5) in the X-direction, and a thickness (FIG. 5) in the Z-direction. Each of data lines data lines 221 and 222 can include a conductive material (or a combination of materials) that can be structured as a conductive line (e.g., conductive region). Example materials for data lines 221 and 222 include metal, conductively doped polysilicon, or other conductive materials.

Access line 241 (associated with signal WL1) can be structured by (can include) a combination of portions 541F and 541B (e.g., front and back conductive portions with respect to the Y-direction). Each of portions 541F and 541B can include a conductive material (or a combination of materials) that can be structured as a conductive line (e.g., conductive region) having a length extending continuously in the X-direction. Thus, portions 541F and 541B can be part of conductive lines that are opposite from each other (e.g., opposite from each other in the Y-direction).

Each of portions 541F and 541B can include a structure (e.g., a piece (e.g., a layer)) of conductive material (e.g., metal, conductively doped polysilicon, or other conductive materials). Each of portions 541F and 541B can have a length (shown in FIG. 5) in the X-direction, a width (shown in FIG. 5) in the Z-direction, and a thickness (shown in FIG. 6) in the Y-direction.

Portions 541F and 541B can be electrically coupled to each other. For example, memory device 200 can include a conductive material (e.g., not shown) that can contact (e.g., electrically couple to) portions 541F and 541B, such that portions 541F and 541B (which are part of a single access line 241) can be concurrently applied by the same signal (e.g., signal WL1).

In an alternative structure of memory device 200, either portion 541F or portion 541B can be omitted, such that access line 241 can include only either portion 541F or portion 541B. In the structure shown in FIG. 5, including two portions 541F and 541B can help better control transistor T1 (e.g., transistor T1, shown schematically in FIG. 2) of each of memory cell 210 and 211 during a read operation).

Charge storage structure 202 can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 202 and portions 541F and 541B of access line 241 can be the same or can be different. As shown in FIG. 5, charge storage structure 202 can include a portion (e.g., top portion) that is farther (e.g., extend in the Z-direction farther) from substrate 599 than each of portions 541F and 541B of access line 241.

FIG. 5 and FIG. 6 show an example where the top edge of charge storage structure 202 is at a specific distance (e.g., distance shown in FIG. 5) from the edge (e.g., top edge) of each of portions 541F and 541B of access line 241. However, the distance between the bottom edge of charge storage structure 202 and the edge (e.g., top edge) of each of portions 541F and 541B may vary.

FIG. 5 and FIG. 6 show an example where portions 541F and 541B overlap (in the Z-direction) charge storage structure 202. However, portions 541F and 541B may not overlap charge storage structure 202.

Memory device 200 can include material 520 located between data line 221 and charge storage structure 202. As shown in FIG. 5, material 520 can be electrically coupled to data line 221 and charge storage structure 202 of memory cell 210. As described above, charge storage structure 202 of memory cell 210 can form the memory element of memory cell 210. Thus, as shown in FIG. 5, memory cell 210 can include material 520 located between a memory element (which is charge storage structure 202) and substrate 599 and with respect to the Z-direction and the memory element contacts (e.g., directly coupled to) material 520.

Material 520 can form a source (e.g., source terminal), a drain (e.g., drain terminal), and a channel region (e.g., write channel region) between the source and the drain of transistor T2 of memory cell 210. Thus, as shown in FIG. 5, the source, channel region, and the drain of transistor T2 of memory cell 210 can be formed from a single piece of the same material (or alternatively, a single piece of the same combination of materials) such as material 520. Therefore, the source, the drain, and the channel region of transistor T2 of memory cell 210 can be formed from the same material (e.g., material 520) of the same conductivity type (e.g., either n-type or p-type).

As shown in FIG. 5, memory device 200 can include material 521 that can form a source (e.g., source terminal), a drain (e.g., drain terminal), and a channel region (e.g., write channel region) between the source and the drain of transistor T2 of memory cell 211. Thus, as shown in FIG. 5, the source, channel region, and the drain of transistor T2 of memory cell 211 can be formed from a single piece of the same material (or alternatively, a single piece of the same combination of materials) such as material 521.

Materials 520 and 521 can be the same. For example, each of materials 520 and 521 can include a structure (e.g., a piece (e.g., a layer) of semiconductor material. In the example where transistor T2 is an NFET (as described above), materials 520 and 521 can include n-type semiconductor material (e.g., n-type silicon).

In another example, the semiconductor material that forms material 520 or material 521 can include a piece of oxide material. Examples of the oxide material used for materials 520 and 521 include semiconducting oxide materials, transparent conductive oxide materials, and other oxide materials.

As an example, each of materials 520 and 521 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the material listed above in memory device 200 provides improvement and benefits for memory device 200. For example, during a read operation, to read information from a selected memory cell (e.g., memory cell 210 or 211), charge from charge storage structure 202 of the selected memory cell may leak to transistor T2 of the selected memory cell. Using the material listed above for the channel region (e.g., material 520 or 521) of transistor T2 can reduce or prevent such a leakage. This improves the accuracy of information read from the selected memory cell and improves the retention of information stored in the memory cells of the memory device (e.g., memory device 200) described herein.

The materials listed above are examples of materials 520 and 521. However, other materials (e.g., a relatively high band-gap material) different from the above-listed materials can be used.

In FIG. 5, material 520 and charge storage structure 202 of memory cell 210 can be electrically coupled (e.g., directly coupled) to each other, such that material 520 can contact charge storage structure 202 of memory cell 210 without an intermediate material (e.g., without a conductive material) between charge storage structure 202 of memory cell 210 and material 520. In another example, material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material, not shown in FIG. 5) between charge storage structure 202 of memory cell 210 and material 520.

As shown in FIG. 5, memory device 200 can include a portion 580 electrically coupled to data line 221. Portion 580 can include a structure (e.g., a piece (e.g., a layer)) of silicon, polysilicon, or other semiconductor material, and can include a doped region (e.g., p-type doped region).

Memory cell 210 can include portions 510A electrically coupled to portion 580, data line 221, and ground connection 297. Portion 510A can include a structure (e.g., a piece (e.g., a layer)) of semiconductor material. Example materials for portion 510 include silicon, polysilicon (e.g., undoped or doped polysilicon), germanium, silicon-germanium, or other semiconductor materials, and semiconducting oxide materials (oxide semiconductors, e.g., SnO or other oxide semiconductors).

As described above with reference to FIG. 2, transistor T1 of memory cell 210 includes a channel region (e.g., read channel region). In FIG. 5, the channel region of transistor T1 of memory cell 210 can include (e.g., can be formed from) portion 510A. As described above with reference to FIG. 2, memory cell 210 can include a read path. In FIG. 5, portion 510 (e.g., the read channel region of transistor T1 of memory cell 210) can be part of the read path of memory cell 210 that can carry a current (e.g., read current) during a read operation of reading information from memory cell 210. For example, during a read operation, to read information from memory cell 210, portion 510A can conduct a current (e.g., read current) between data line 221 and ground connection 297 (through part of portion 580). The direction of the read current can be from data line 221 to ground connection 297. In the example where transistor T1 is a PFET and transistor T2 is an NFET, the material that forms portion 510A can have a different conductivity type from material 520 or 521. For example, portion 510A can include p-type semiconductor material (e.g., p-type silicon) regions, and materials 520 and 521 can include n-type semiconductor material (e.g., n-type gallium phosphide (GaP)) regions.

As shown in FIG. 5, memory cell 210 can include a dielectric 515B to electrically separate a respective charge storage 202 of memory cells 210 and 211 from ground connection 297. Memory cell 210 can include a dielectric 515A. Dielectric 515A can be a gate oxide region that electrically separates charge storage structure 202 from portion 510A, and electrically separate material 520 from portion 510A. Example materials for dielectric 515A include silicon dioxide, hafnium oxide (e.g., $HfO_2$), aluminum oxide (e.g., $Al_2O_3$), or other dielectric materials. In an example structure of memory device 200, dielectric 515A includes a high-k dielectric material (e.g., a dielectric material having a dielectric constant greater than the dielectric constant of silicon dioxide). Using such a high-k dielectric material (instead of silicon dioxide) can improve the performance (e.g., reduce current leakage, increase drive capability of transistor T1, or both) of memory device 200.

As shown in FIG. 5, part of portion 541F can span across (e.g., overlap in the X-direction) part of portion 510A and part of material 520. As described above, portion 510A can form part of read channel region of transistor T1 and material 520 can form part of write channel region of transistor T2. Thus, as shown in FIG. 5, part of portion 541F can span across (e.g., overlap) part of (e.g., on a side (e.g., front side) in the Y-direction) both read and write channels of transistors T1 and T2, respectively. Although hidden from the view shown in FIG. 5 (but can be seen in FIG. 6), part of portion 541B can span across (e.g., overlap in the X-direction) part of (e.g., on another side (e.g., back side opposite from the front side) in the Y-direction) portion 510A and a part of material 520. As shown in FIG. 5, access line 241 can also span across (e.g., overlap in the X-direction) part of portion 511A (e.g., a portion of the read channel region of transistor T1 of memory cell 211) and part of material 521 (e.g., a portion of write channel region of transistor T2 of memory cell 211).

The spanning (e.g., overlapping) of access line 241 across portion 510A and material 520 allows access line 241 (a single access line) to control (e.g., to turn on or turn off) both transistors T1 and T2 of memory cell 210 and both transistors of memory cell 211. Similarly, the spanning (e.g., overlapping) of access line 241 across portion 511A and material 521 allows access line 241 (a single access line) to control (e.g., turn on or turn off) both transistors T1 and T2 of memory cell 211.

As shown in FIG. 5, memory device 200 can include a dielectric portion 531 and a dielectric portion 532 where memory cells 210 and 211 can be located between dielectric portions 531 and 532. Dielectric portion 531 can electrically isolate memory cell 210 from another memory cell (e.g., the memory cell on the left (not shown) of memory cell 210. Dielectric portion 532 can electrically isolate memory cell 211 from another memory cell (e.g., the memory cell on the right (not shown) of memory cell 211.

As shown in FIG. 5, memory device 200 can include dielectric (e.g., dielectric material) 526 that can form a structure to electrically separate (e.g., isolate) parts of two adjacent (in the X-direction) memory cells of memory device 200. For example, dielectric 526 can electrically separate material portion 510A (e.g., read channel region of transistor T1 of memory cell 210) from portion 521 (e.g., read channel region of transistor T2 of memory cell 211). As shown in FIG. 5, dielectric 526 can include a side (e.g., left side in the X-direction) contacting portion 510A (read channel region) of memory cell 210, and a side (e.g., right side in the X-direction) contacting portion 511A (read channel region) of memory cell 211.

Dashed line 526D can indicate an imaginary boundary (e.g., boundary between adjacent cells) of each memory cells 210 and 211. As shown in FIG. 5, portion 510A (e.g., read channel region) of memory cell 210 is located on the outside (next to the imaginary boundary) memory cell 210. Thus, memory cell 210 can be said to include an outside read channel region. Similarly, portion 511A (e.g., read channel region) of memory cell 211 is located on the outside (next to the imaginary boundary) memory cell 211. Thus, memory cell 211 can be said to include an outside read channel region As shown in FIG. 5, some of portions (e.g., materials) of memory cells 210 and 211 can be formed adjacent (e.g., formed on) respective side walls (e.g., vertical portion with respect the Z-direction) of dielectric portions 531 and 532. For example, as shown in FIG. 5, portion 510A (e.g., semiconductor material portion) of memory cell 210 can be formed adjacent (e.g., formed on) a side wall (not labeled)

of dielectric portion 531. In another example, as shown in FIG. 5, portion 511A (e.g., semiconductor material portion) of memory cell 210 can be formed adjacent (e.g., formed on) a side wall (not labeled) of dielectric portion 532.

As shown in FIG. 6, memory device 200 can include dielectrics 518F and 518B (e.g., oxide regions) to electrically separate portions 541F and 541B of access line 241 from other elements (e.g., from portions 510A and 511A (e.g., read channel regions), charge storage structure 202, and materials 520 and 521) of memory cells 210 and 211. The material (or materials) for dielectrics 518F and 518B can be the same as (or alternatively, different from) the material (or materials) of dielectric 515A. Example materials for portions 518F and 518B can include silicon dioxide, hafnium oxide (e.g., $HfO_2$), aluminum oxide (e.g., $Al_2O_3$), or other dielectric materials.

As shown in FIG. 6, portions 541F and 541B can be adjacent respective sides of material 520 and charge storage structure 202 of memory cell 210. For example, portion 541F can be adjacent a side (e.g., right side in the X-direction in the view of FIG. 6) of a portion of each of material 520 and charge storage structure 202. In another example, portion 541B can be adjacent another side (e.g., left side (opposite from the right side) in the X-direction in the view of FIG. 6) of a portion of each of material 520 and charge storage structure 202.

The above description focuses on the structure of memory cell 210. Memory cell 211 can include elements structured in ways similar or identical to the elements of memory cell 210, described above. For example, as shown in FIG. 5, memory cell 211 can include charge storage structure 202, channel region (e.g., write channel region) 521, portion 581 (which is similar to portion 580), and portion 511A (e.g., read channel region). The material (or materials) for dielectrics 525A and 525B can the same as the material (or materials) for dielectric 515A.

As described above with reference to FIG. 2 through FIG. 6, the connection and structure of memory device 200 can allow a cross-point operation in that a memory cell (e.g. memory cell 210) of a memory device can be accessed using a single access line (e.g., access line 241) and a single data line (e.g., data line 211) during an operation (e.g., a read or write operation) of memory device 200. Such a cross-point operation can be achieved due in part to a terminal (e.g., a source terminal) of transistor T1 of each of the memory cells (e.g., memory cell 210 through 215) being coupled to a ground connection. This ground connection allows a voltage level at a terminal (e.g., source terminal) of transistor T1 of a selected memory cell to remain unchanged (e.g., remain unswitched at 0V), thereby allowing the cross-point operation. The cross-point operation and the structure of memory device 200 can provide better memory performance in comparison with some conventional volatile memory devices (e.g., DRAM devices).

FIG. 7 through FIG. 19 show different views of elements during processes of forming a memory device 700, according to some embodiments described herein. Some or all of the processes used to form memory device 700 can be used to form memory device 200 described above with reference to FIG. 2 through FIG. 6.

Figure 7:
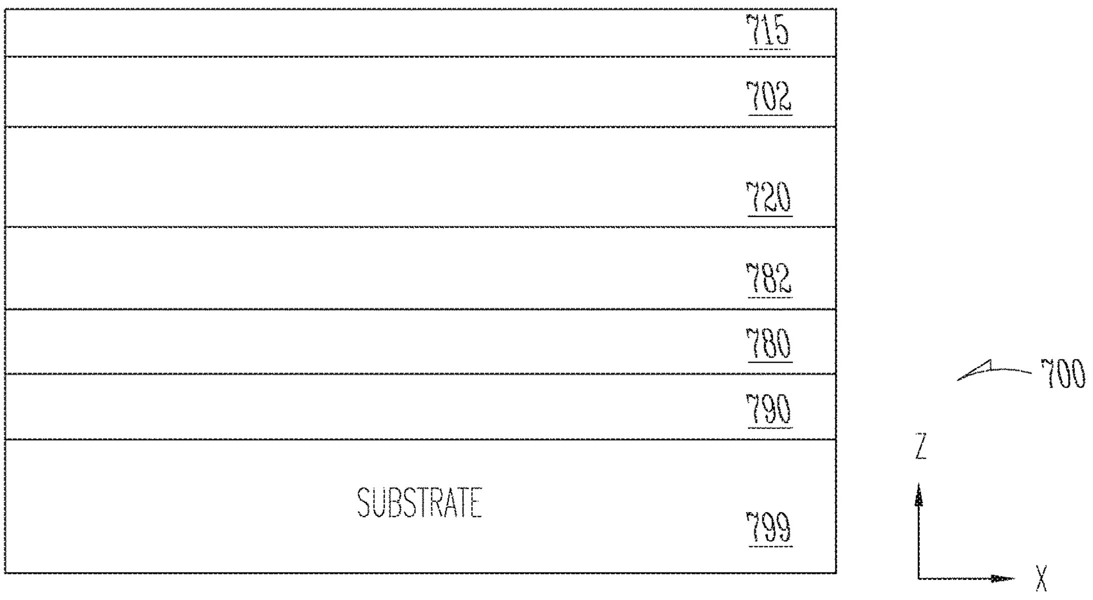
FIG. 7 through FIG. 21 show processes of forming a memory device, according to some embodiments described herein.

FIG. 7 shows memory device 700 after different levels (e.g., layers) of materials are formed in respective level (e.g., layer) in the Z-direction of memory device 700 over a substrate 799. The different levels of materials include a dielectric material 790, a semiconductor material 780, a conductive material 782, a material 720, a material 702, and a dielectric 715. The levels of materials shown in FIG. 7 can be formed in a sequential fashion one material after another over substrate 799. For example, the processes used in FIG. 7 can include forming (e.g., depositing) dielectric material 790 over substrate 799, forming (e.g., depositing) a semiconductor material 780 over dielectric material 790, forming (e.g., depositing) a conductive material 782 over semiconductor material 780, forming (e.g., depositing) material 720 over conductive material 782, forming (e.g., depositing) material 702 over a material 720, and forming (e.g., depositing) material dielectric material 715 over material 702.

Substrate 799 can be similar to or identical to substrate 599 of memory device 200 of FIG. 5. Dielectric materials 790 and 715 can include the same dielectric material or different dielectric materials. Each of dielectric materials 790 and 715 and can include nitride material (e.g., silicon nitride (e.g., $Si_3N_4$)), oxide material (e.g., $SiO_2$)), or other dielectric materials.

Semiconductor material 780 can include the same material as portions 580 and 581 of FIG. 5. For example, semiconductor material 780 can include silicon, polysilicon, or other semiconductor material, and can include a doped region (e.g., p-type doped region). Conductive material 782 can include the same material as data lines 221 and 222 (e.g., metal, conductively doped polysilicon, or other conductive materials).

Material 702 can include the same material as charge storage structure 202 of memory cell 210 of FIG. 5. For example, material 702 can include a charge storage material (or a combination of materials), which can include semiconductor material (e.g., polysilicon), metal, or other materials that can trap charge.

Material 720 can include the same material as write channel region (e.g., material 520) of transistor T2 of memory cell 210 of FIG. 5. For example, material 720 can include a semiconducting material. The semiconducting material can include an oxide material. Examples of the oxide material include semiconducting oxide materials, transparent conductive oxide materials, and other oxide materials.

Figure 8:
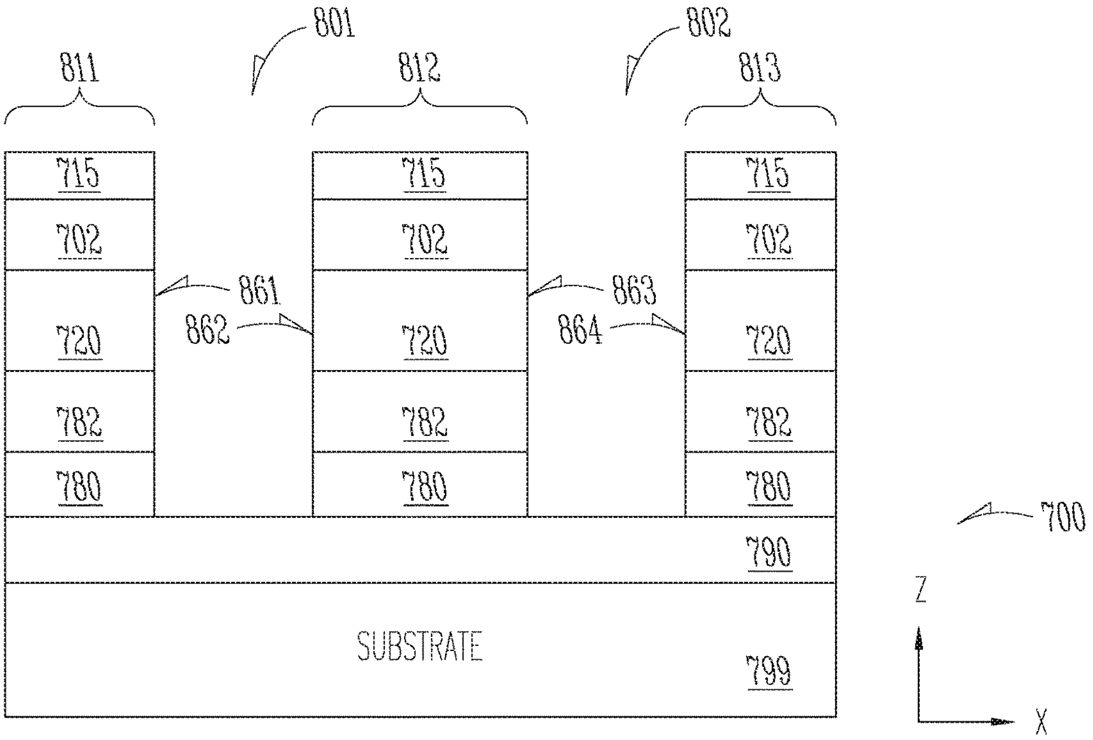

FIG. 8 shows memory device 700 after trenches (e.g., openings) 801 and 802 are formed. Forming trenches 801 and 802 can include removing (e.g., by patterning) a portion of each of semiconductor material 780, conductive material 782, material 720, material 702, and dielectric material 715 at the locations of trenches 801 and 802. The remaining portions of semiconductor material 780, conductive material 782, material 720, material 702, and dielectric material 715 are included in structures (e.g., device structures) 811, 812, and 813, as shown in FIG. 8.

Each of trenches 801 and 802 can have a length in the Y-direction, a width (shorter than the length) in the X-direction, and a bottom (not labeled) resting on (e.g., bounded by) a respective portion of dielectric material 790. Structures 811, 812, and 813 can include respective side walls (e.g., opposing vertical side walls) 861, 862, 863, and 864, which also form side walls of respective trenches 801 and 802. For example, structure 811 can include a side wall 861, structure 812 can include side walls 862 and 863, and structure 813 can include a side wall 864. Side walls 861 and 862 can form side walls of trench 801. Side walls 863 and 864 can form side walls of trench 802.

Figure 9:
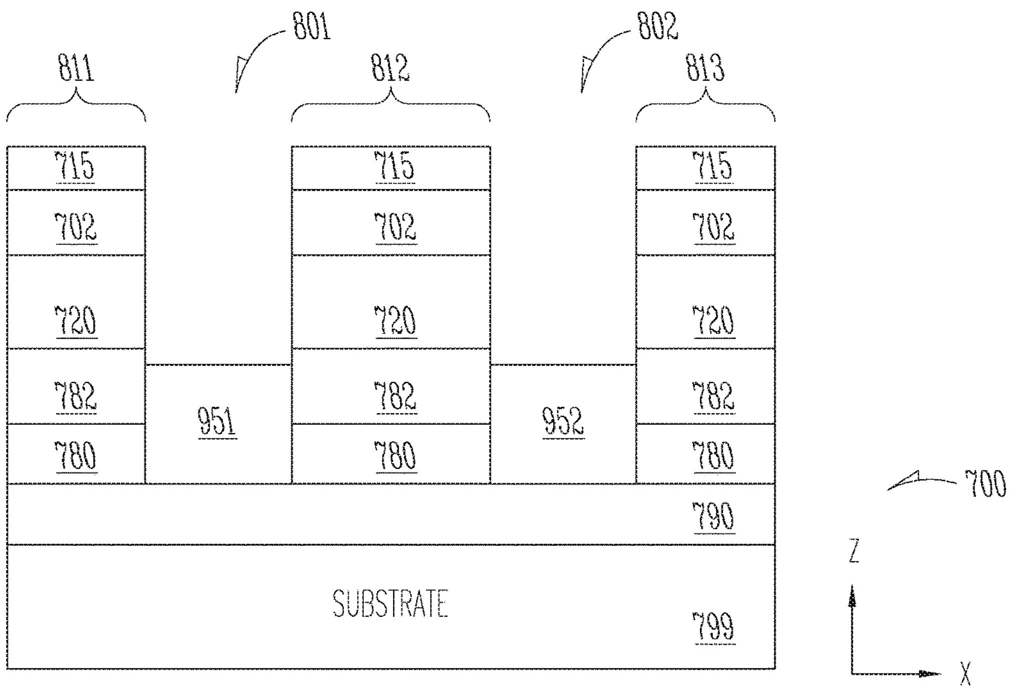

FIG. 9 shows memory device 700 after materials (e.g., sacrificial materials) 951 and 952 are formed in trenches 801 and 802, respectively. Examples of materials 951 and 952 include a dielectric material (e.g., silicon nitride).

Figure 10:
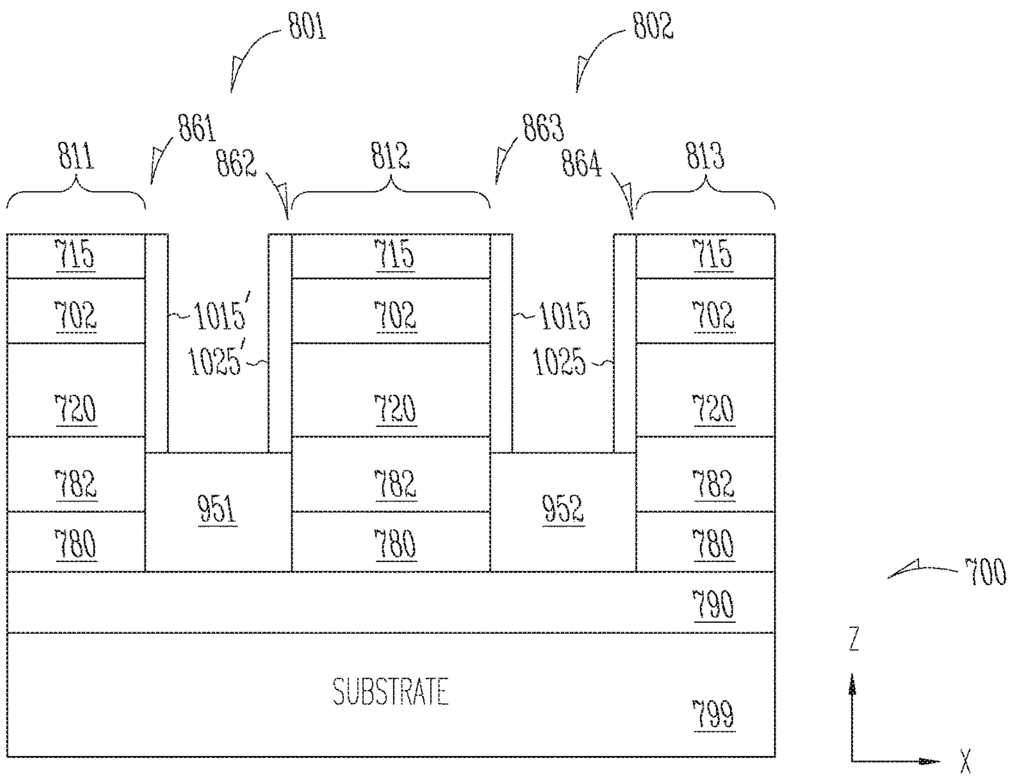

FIG. 10 shows memory device 700 after dielectric materials (e.g., dielectrics) 1015, 1025, 1015', and 1025' are formed on respective side walls 861, 862, 863, and 864 of trenches 801 and 802. As shown in FIG. 10, each of dielectric materials (e.g., dielectrics) 1015, 1025, 1015', and 1025' are formed on a portion (not the entire) of a respective side wall among side walls 861, 862, 863, and 864 because the other portion of each of side walls 861, 862, 863, and 864 is occupied (e.g., blocked) by dielectric material 951 or 952.

Figure 11:
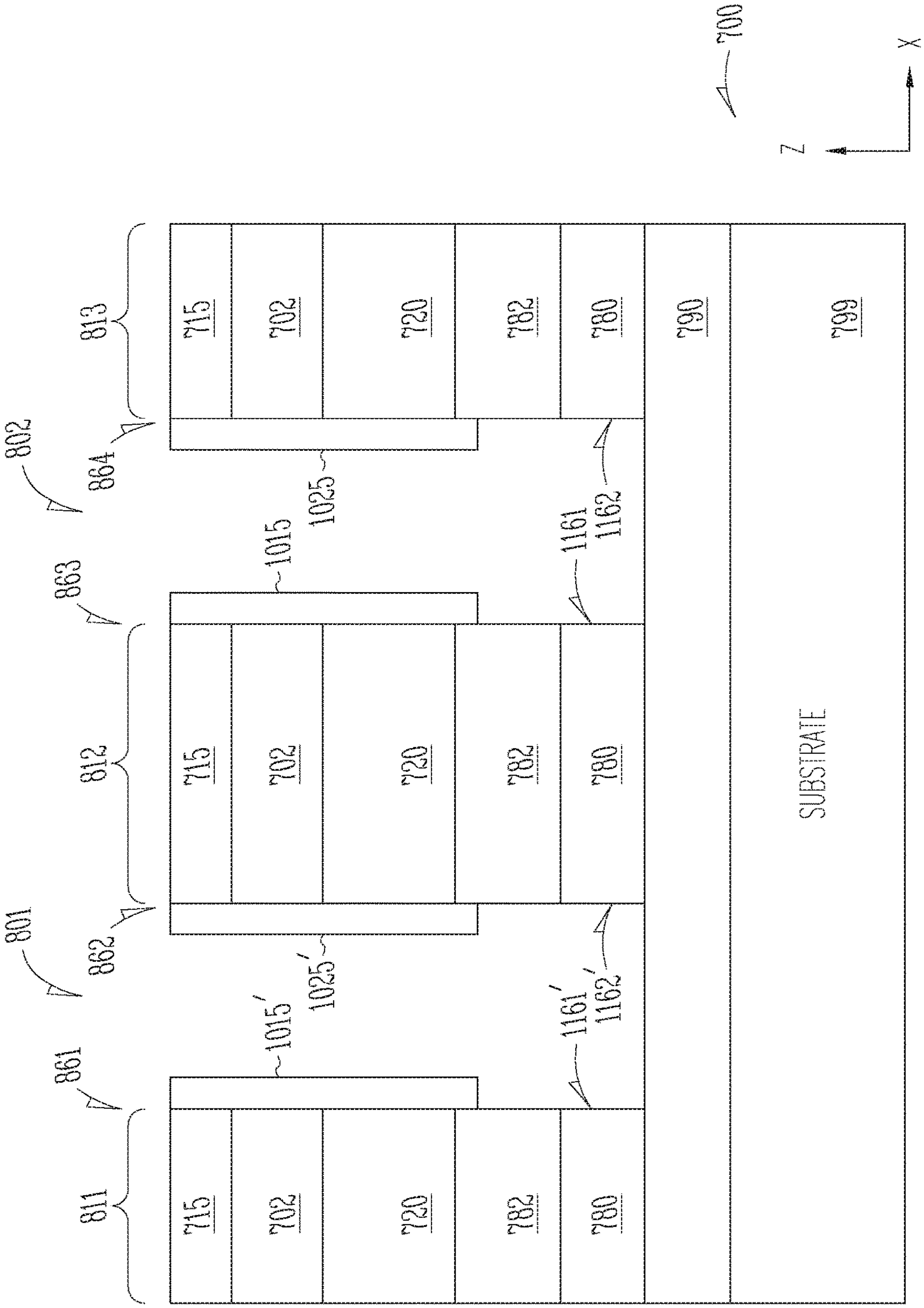

FIG. 11 shows memory device 700 after materials 951 and 952 are removed. The removal of materials 951 and 952 exposes portions (side wall portions) 1161, 1162, 1161', and 1162' of side walls 863, 864, 861, and 862, respectively, in respective trenches 801 and 802. As shown in FIG. 11, portions 1161, 1162, 1161', and 1162' can be formed from respective portions of material 780.

Figure 12:
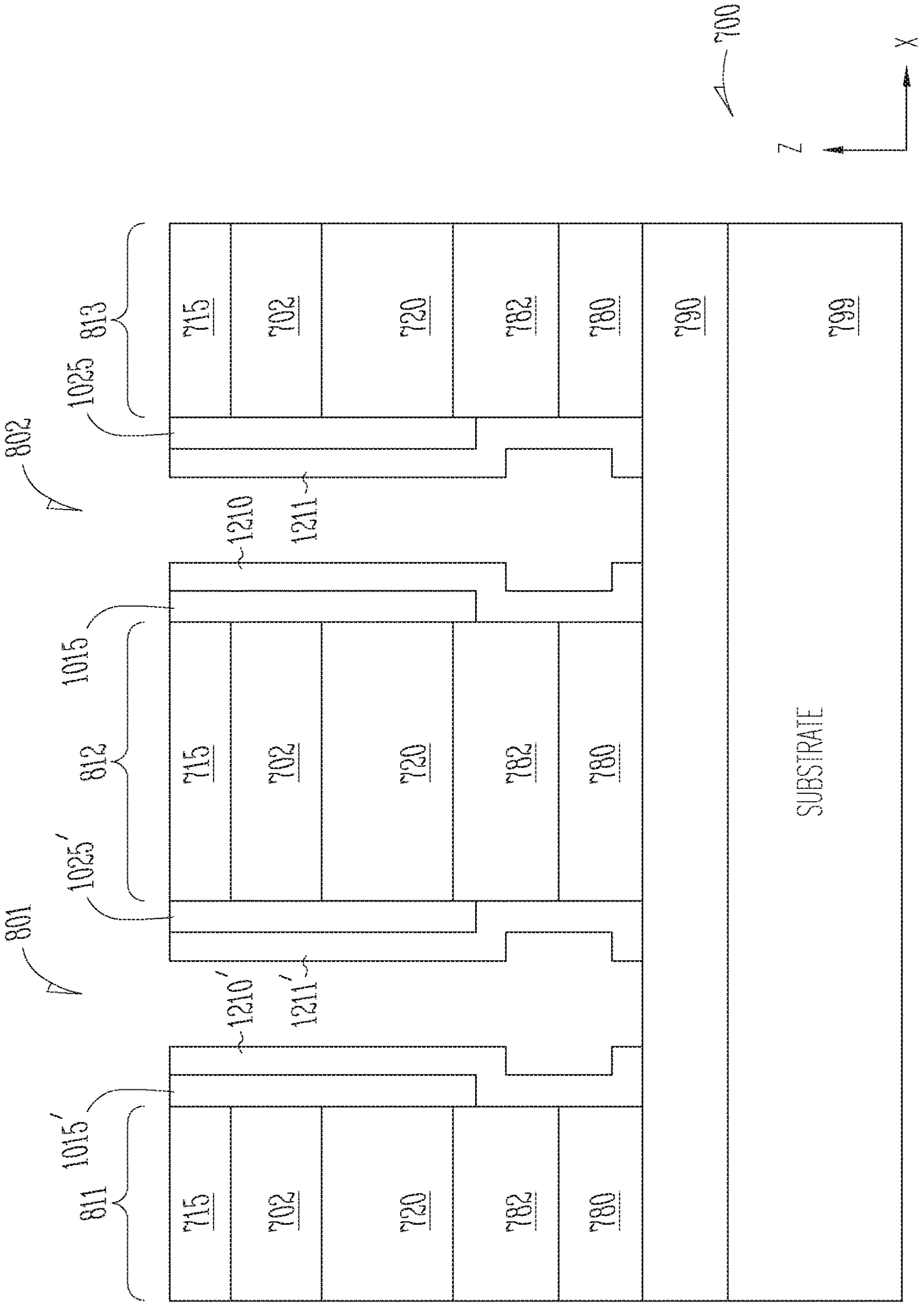

FIG. 12 shows memory device 700 after semiconductor materials 1210, 1211, 1210', and 1211' are formed adjacent dielectric materials 1015, 1025, 1015', and 1025', respectively. Semiconductor materials 1210, 1211, 1210', and 1211' are electrically separated from each other. As shown in FIG. 12, each of semiconductor materials 1210, 1211, 1210', and 1211' can contact (e.g., electrically coupled to) a portion (e.g., one of portions 1161, 1162, 1161', and 1162') of a respective side wall among side walls 861, 862, 863, and 864. Thus, each of semiconductor materials 1210, 1211, 1210', and 1211' in FIG. 12 can contact (e.g., electrically coupled to) the materials of structures 811, 812, and 813 that are exposed at 1161, 1162, 1161', and 1162' (FIG. 11). For example, as shown in FIG. 12, semiconductor material 1210 can contact semiconductor material 780 and conductive material 782 of portion 812. Semiconductor materials 1211 can contact semiconductor material 780 and conductive material 782 of portion 813. Semiconductor material 1210' can contact semiconductor material 780 and conductive material 782 of structure 811. Semiconductor materials 1211' can contact semiconductor material 780 and conductive material 782 of portion 812.

Figure 13:
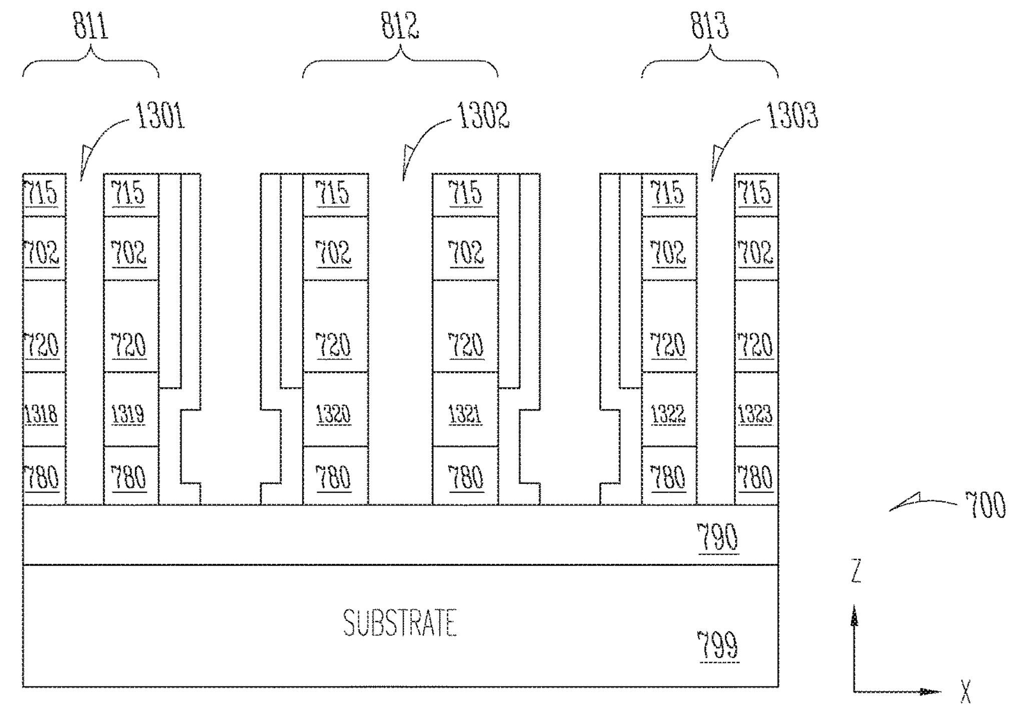

FIG. 13 shows memory device 700 after trenches (e.g., openings) 1301, 1302, and 1303 are formed. Forming trenches 1301, 1302, and 1303 can include removing (e.g., by patterning) part of each of semiconductor material 780, conductive material 782, material 720, material 702, and dielectric material 715 at the locations of trenches 1301, 1302, and 1303. As shown in FIG. 13, data lines 1318, 1319, 1320, 1321, 1322, and 1323 can be formed from remaining portions of conductive materials 782 of respectively structures 811, 812, and 813. Data lines 1318, 1319, 1320, 1321, 1322, and 1323 are electrically separated from each other. Each of data lines 1318, 1319, 1320, 1321, 1322, and 1323 can have a length (hidden from view in FIG. 13) in the Y-direction. Data lines 1321 and 1322 can correspond to data lines 221 and 222, respectively, of memory device 200 (FIG. 2 and FIG. 5).

Figure 14:
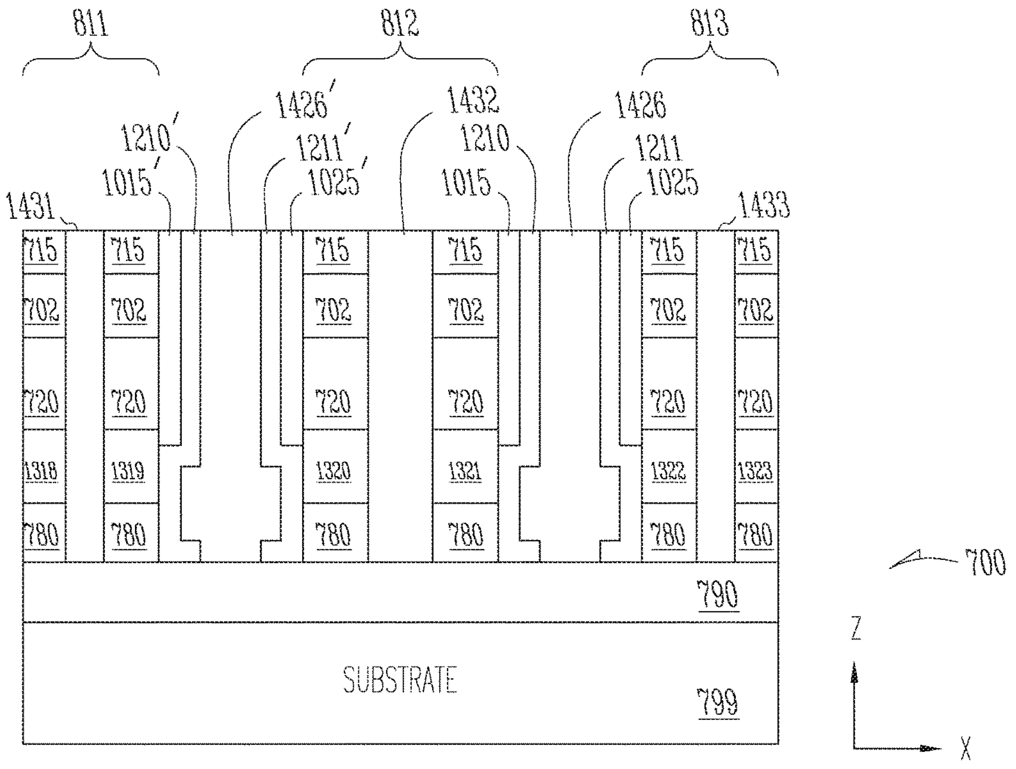

FIG. 14 shows memory device 700 after dielectric materials (dielectrics) 1431, 1432, 1433, 1426, and 1426' are formed. Dielectric materials 1431, 1432, and 1433 can be formed (e.g., deposited) in trenches 1301, 1302, and 1303 (labeled in FIG. 13), respectively. Dielectric material 1426 can be formed between semiconductor materials 1210 and 1211. Dielectric material 1426' can be formed between semiconductor materials 1210' and 1211'. Dielectric materials 1431, 1432, 1433, 1426, and 1426' can form dielectrics (e.g., cell isolation structures) between adjacent memory cells in the X-direction.

Dielectric materials 1431, 1432, and 1433 can be formed at the same time (e.g., formed in the same deposition process). Dielectric materials 1426 and 1426' can be formed at the same time (e.g., formed in the same deposition process).

Dielectric materials 1431, 1432, and 1433 can be formed at the same time (e.g., formed in the same deposition process) as dielectric materials 1426 and 1426'. Alternatively, dielectric materials 1431, 1432, and 1433 can be formed at a different time (e.g., formed before or after) that dielectric materials 1426 and 1426' are formed.

FIG. 12, FIG. 13, and FIG. 14 show an example where dielectric materials 1426 and 1426' are formed after trenches 1301, 1302, and 1303 (FIG. 13) are formed. However, dielectric materials 1426 and 1426' can be formed before trenches 1301, 1302, and 1303 (FIG. 13) are formed. For example, the process associated with FIG. 12 can include forming dielectric materials 1426 and 1426' after semiconductor materials 1210, 1211, 1210', and 1211 (FIG. 12) are formed and before trenches 1301, 1302, and 1303 (FIG. 13) are formed.

Figure 15:
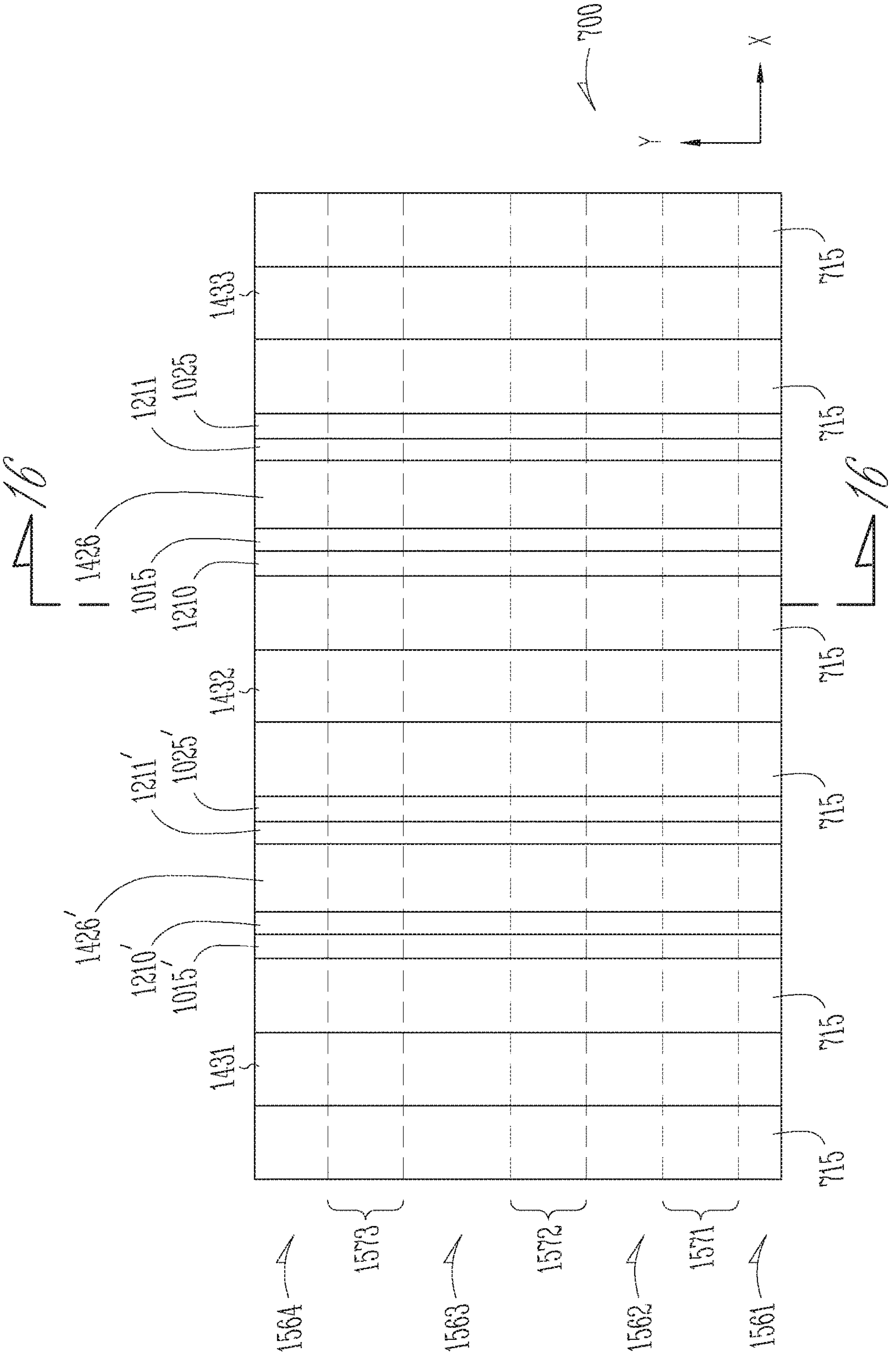

FIG. 15 shows a top view of memory device 700 with respect to the X-Y directions of memory device 700 of FIG. 14. For simplicity, the description of the same element shown in FIG. 14 and FIG. 15 is not repeated. As shown in FIG. 15, the elements of memory device 700 can include strips (e.g., lines) of materials having lengths extending in the Y-direction. Subsequent processes of forming memory device 700 can include removing (e.g., cutting (e.g., etching) in the Z-direction) the materials at locations 1561, 1562, 1563, and 1564 (1561-1564) down to (stopping at) data lines 1319, 1320, 1321, and 1322 (FIG. 13). This way, each of data lines 1319, 1320, 1321, and 1322 (which have length extending in the Y-direction) can remain extending continuously in the Y-direction and electrically coupled to memory cells (e.g., in column) in the Y direction. The materials of memory device 700 at locations 1571, 1572, and 1573 can remain (and will be structures that form parts of respective memory cells of memory device 700). A view along line 16-16 of memory device 700 after the removal (e.g., cut) of the materials at locations 1561-1564 is shown in FIG. 16.

Figure 16:
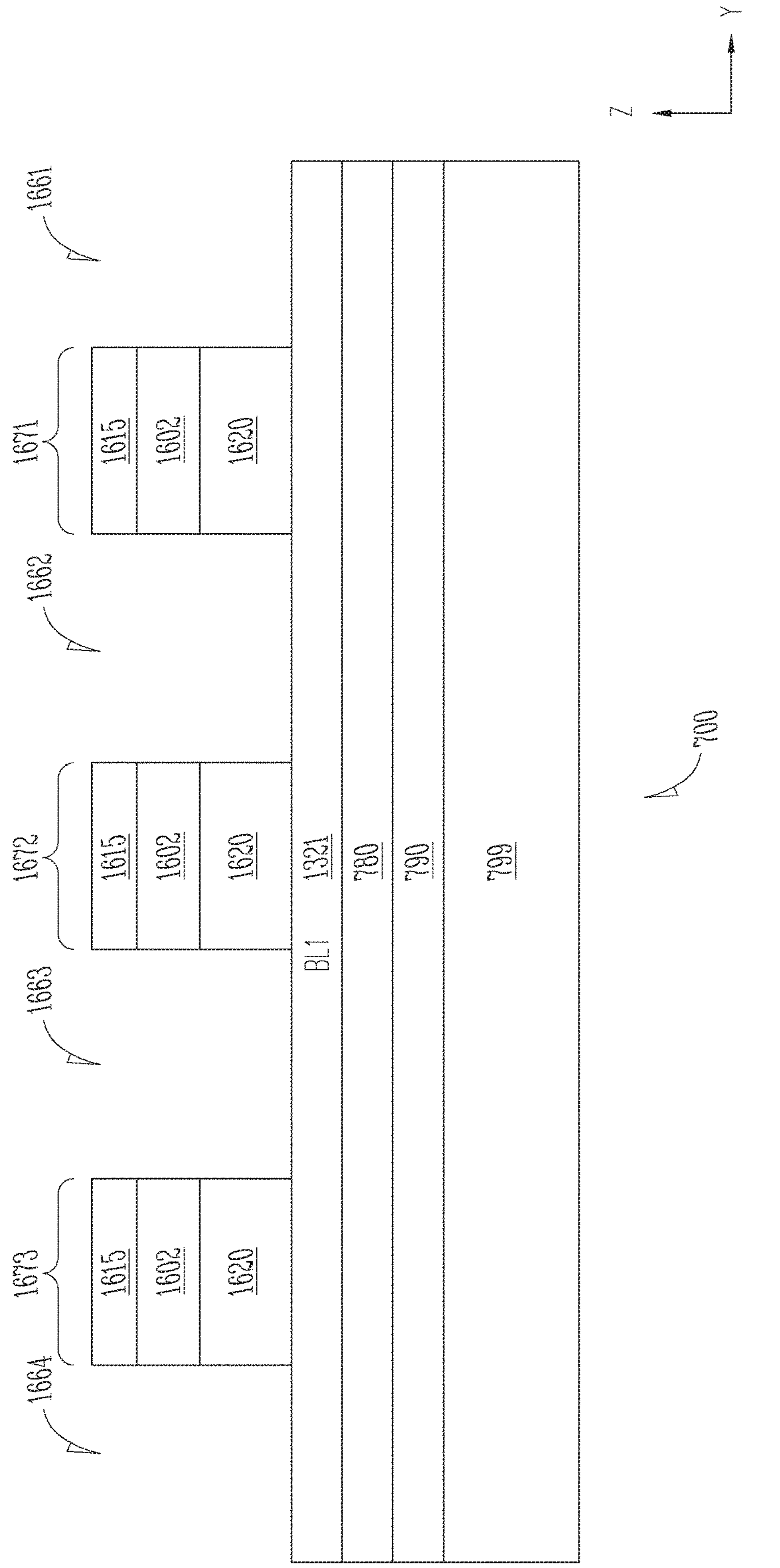

FIG. 16 shows a side view of memory device 700 along line 16-16 of FIG. 15 with respect to the Y-Z directions after trenches (e.g., openings) 1661, 1662, 1663, and 1664 (1661-1664) are formed at locations 1561-1564 (FIG. 15), respectively. As shown in FIG. 16, the materials at trenches 1661-1664 (at locations 1561-1564) were removed, stopping at (e.g., down to) data line 1321 (and also stopping at data lines 1319, 1320, and 1322 (FIG. 13), not shown in FIG. 16).

Trenches 1661-1664 can be formed by removing (e.g., cut in the X-direction) part of each of the materials at locations 1561-1564, including dielectric material 715, material 702 (under material 715 in FIG. 15, and material 720 under material 702 in FIG. 15), dielectric materials 1431, 1432, and 1433, dielectric materials 1426 and 1426', dielectric materials 1015, 1015', 1025, and 1025', and semiconductor materials 1210, 1210', 1211, and 1211'. In FIG. 16, portions 1615, 1602, and 1620 at each of structures (e.g., device structures) 1671, 1672, and 1673 are remaining parts of dielectric material 715, material 702, and material 720, respectively (FIG. 15) after trenches 1661-1664 in FIG. 16 are formed. Each of structures 1671, 1672, and 1673 can be part of a memory cell in subsequent processes of forming memory device 700.

Figure 17:
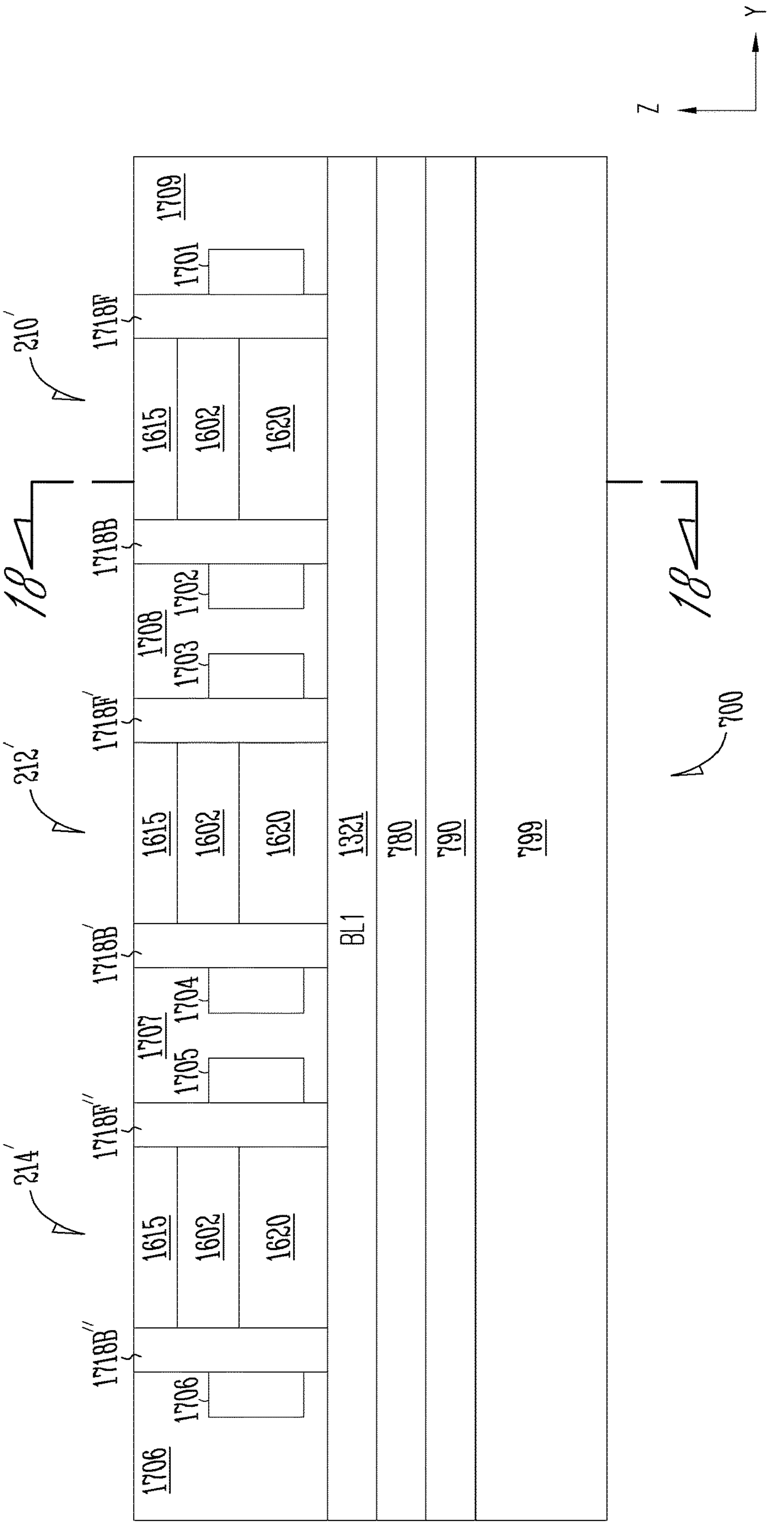

FIG. 17 shows memory device 700 of FIG. 16 after dielectric materials (e.g., gate oxides) 1718B, 1718F, 1718B', 1718F', 1718B", and 1718F", conductive lines (e.g., conductive regions) 1701, 1702, 1703, 1704, 1705, and 1706 (1701-1706), and dielectric materials 1706, 1707, 1708, and 1709 (1706-1709) are formed in respective trenches 1661-1664 (labeled in FIG. 16). Each of dielectric materials 1718B, 1718F, 1718B', 1718F', 1718B", and 1718F" and dielectric materials 1706-1709 can include silicon dioxide or other dielectric materials. Each of conductive lines 1701-1706 can include metal, conductively doped polysilicon, or other conductive materials.

Conductive lines 1701-1706 can form part of access lines (e.g., word lines) to access memory cells 210', 212' and 214' of memory device 700. Memory cells 210', 212', and 214' can correspond to memory cells 210, 212, and 214, respectively, of memory device 200 of FIG. 2.

In FIG. 17, conductive lines 1701 and 1702 can form part of an access line (e.g., word line) to access memory cell 210' and other memory cells (not shown in FIG. 17) of memory device 700. Such other memory cells can be located in the same row with memory cell 210' in the X-direction (e.g., memory cells 208', 209', and 211', shown in FIG. 18).

In FIG. 17, conductive lines 1703 and 1704 can form part of an access line (e.g., word line) to access memory cell 212' and other memory cells (not shown) of memory device 700. Conductive lines 1705 and 1706 in FIG. 17 can form part of an access line (e.g., word line) to access memory cell 214' and other memory cells (not shown) of memory device 700.

As shown in FIG. 17, conductive line 1701 can have a portion adjacent a side (e.g., right side in the Y-direction) of the channel region (e.g., portion 1620) of memory cell 210'. Conductive line 1702 can have a portion adjacent another side (e.g., left side (opposite from the right side) in the Y-direction) of the channel region (e.g., portion 1620) of memory cell 210'.

Similarly, conductive lines 1703 and 1704 can have respective portions (e.g., respective conductive regions) adjacent respective sides (opposite sides) in the Y-direction of a channel region (e.g., read channel region) of memory cell 212'. Conductive lines 1705 and 1706 can have respective portions (e.g., respective conductive regions) adjacent respective sides (opposite sides) in the Y-direction of a channel region (e.g., read channel region) of memory cell 214'. Another view of memory device 700 along line 18-18 is shown in FIG. 18.

Figure 18:
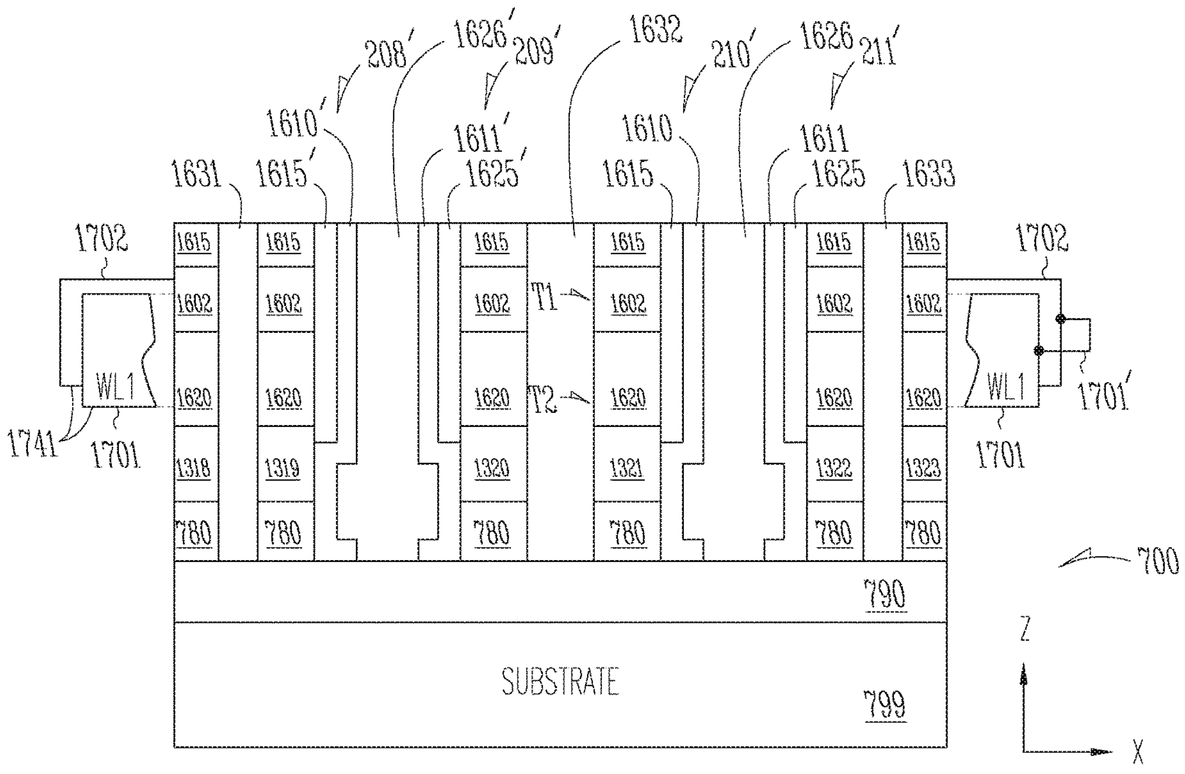

FIG. 18 shows a side view along line 18-18 of FIG. 17 with respect to the X-Z directions. In FIG. 18, conductive lines 1701 and 1702 are partially shown to avoid obstructing some parts of the other the elements of memory device 700. As shown in FIG. 18, each of the conductive lines can have a length in the X-direction, a width in the Z-direction, and a thickness (e.g., less than the width) in the Y-direction (shown in FIG. 17).

In FIG. 18, portions (semiconductor portions) 1610, 1611, 1610', and 1611' are the remaining part of portions 1210, 1211, 1210', and 1211', respectively, of FIG. 14 after part of each of portions 1210, 1211, 1210', and 1211' is removed (e.g., cut) in the processes of FIG. 16 (and before conductive lines 1701-1706 are formed in the processes of FIG. 17).

In FIG. 18, portions (dielectric portions) 1615, 1625, 1615', and 1625' are the remaining part of portions 1015, 1025, 1015', and 1025', respectively, of FIG. 14 after part of each of portions 1015, 1025, 1015', and 1025', is removed (e.g., cut) in the processes of FIG. 16 (and before conductive lines 1701-1706 are formed in the processes of FIG. 17).

In FIG. 18, dielectrics 1631, 1632, and 1633 are the remaining part of portions of dielectric materials 1431, 1432, and 1433, respectively, of FIG. 14 after part of each of dielectric materials 1431, 1431, and 1433 is removed (e.g., cut) in the processes of FIG. 16 (and before conductive lines 1701-1706 are formed in the processes of FIG. 17).

In FIG. 18, dielectrics 1626 and 1626' are the remaining part of portions of dielectric materials 1426 and 1426', respectively, of FIG. 14 after part of each of dielectric materials 1426 and 1426' is removed (e.g., cut) in the processes of FIG. 16 (and before conductive lines 1701-1706 are formed in the processes of FIG. 17). Each of dielectrics 1626 and 1626' can form a structure to electrically separate (e.g., isolate) parts of two adjacent (in the X-direction) memory cells of memory device 200. As shown in FIG. 16 each of dielectrics 1626 and 1626' can include sides (e.g., right and left sides in the X-direction) contacting read channel regions of adjacent memory cells. For example, dielectric 1626 can include a side (e.g., left side in the X-direction) contacting portion 1610 (e.g., read channel region) of memory cell 210', and a side (e.g., right side in the X-direction) contacting portion 1611 (read channel region) of memory cell 211'.

In FIG. 18, each of portions 1602 can form the charge storage structure (e.g., memory element) of a respective memory cell among memory cells 208', 209', 210', and 211'. Each of memory cells 208', 209', 210', and 211' can have transistors T1 and T2 similar to transistors T1 and T2 of memory device 200 of FIG. 5. For simplicity, only transistors T1 and T2 of memory cell 210' are labeled in FIG. 18.

Each of portions 1610, 1611, 1610', and 1611' can forma channel region (e.g., read channel region) of a transistor T1 of a respective memory cell among memory cells 208', 209', 210', and 211'. Each of portions 1620 can form a channel region (e.g., write channel region) of a transistor T2 of a respective memory cell among memory cells 208', 209', 210', and 211'.

In FIG. 18, conductive lines 1701 and 1702 can be part of an access line (e.g., word line) 1741 (which can receive a signal (e.g., word line signal) WL1 to access memory cell 208', 209', 210', and 211' during an operation of memory device 700. Access line 1741 can correspond to access line 241 of memory device 200 of FIG. 2.

As shown in FIG. 18, part of conductive line 1701 can span across (e.g., overlap in the X-direction) part of portions 1610 and part of portion 1620 of memory cell 210'. As described above, portion 1610 can form part of a read channel region of transistor T1 of memory cell 210', and portion 1620 of memory cell 210' can form part of a write channel region of transistor T2 of memory cell 210'. Thus, as shown in FIG. 18, part of conductive line 1701 can span across (e.g., overlap) part of (e.g., on a side (e.g., front side) in the Y-direction) both read and write channel regions of transistors T1 and T2, respectively, of memory cell 210'. Although hidden from the view shown in FIG. 18, part of conductive line 1702 can span across (e.g., overlap in the X-direction) part of (e.g., on another side (e.g., back side opposite from the front side) in the Y-direction) portions 1610 and a part of portion 1620 (e.g., read and write channel regions of transistors T1 and T2, respectively) of memory cell 210'.

Similarly, part of each of conductive lines 1701 and 1702 can span across part of a read channel region (e.g., portion 1610', 1611', or 1611) and part of a write channel region (e.g., portion 1620 above data line 1319, 1320, or 1322) of each of memory cell 208', 209', and 211'.

The processes of forming memory device 700 in FIG. 18 can include forming a conductive connection 1701' (which can include a conductive material (e.g., metal)) to electrically couple conductive lines 1701 and 1702 to each other. Similarly, the processes of forming memory device 700 can include forming a conductive connection (not shown) to electrically couple conductive lines 1703 and 1704 (FIG. 17)

to each other, and forming a conductive connection (not shown) to electrically couple conductive lines 1705 and 1706 (FIG. 17) to each other.

Figure 19:
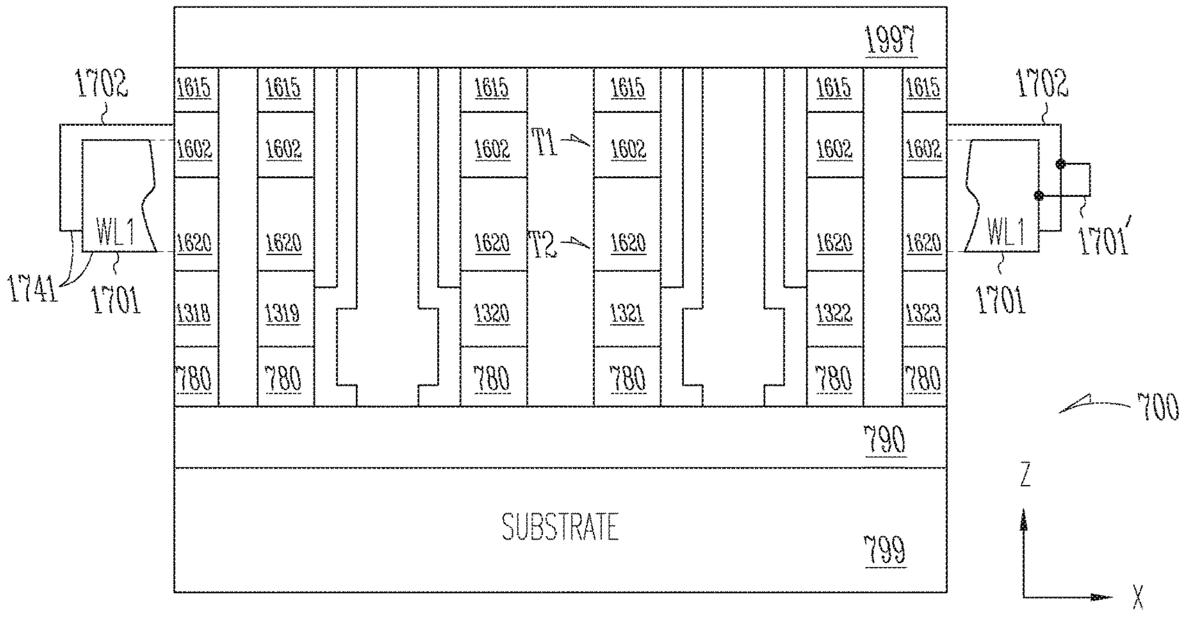

FIG. 19 shows memory device 700 after a conductive plate 1997 is formed (e.g., deposited) over other elements (e.g., memory cells 208', 209', 210', and 211') of memory device 700. Example materials for conductive plate 1997 include metal, conductively doped polysilicon, or other conductive materials. As shown in FIG. 19, conductive plate 1997 can contact (e.g., electrically couple to) portions (e.g., read channel regions) 1610, 1611, 1610', and 1611' of memory cells 208', 209', 210', and 211', respectively.

The description of forming memory device 700 with reference to FIG. 11 through FIG. 19 can include other processes to form a complete memory device. Such processes are omitted from the above description so as to not obscure the subject matter described herein.

The process of forming memory device 200 as described above can have a relatively reduced number of masks (e.g., reduced number of critical masks) in comparisons with some conventional processes. For example, by forming trenches 801 and 802 in the process associated with FIG. 8, and forming trenches 1661-1664 in the process associated with FIG. 16, the number of critical masks used to form the memory cells of memory device can be reduced. The reduced number of masks can simplify the process, reduce cost, or both, of forming memory device 200. Further, forming some of the elements (e.g., charge storage structure and write channel region) using the techniques described herein can be more advantageous than using some other techniques. For example, some of the structures (e.g., charge storage structure and write channel region) of the memory cells described herein can formed by depositing a material over (e.g., on top of) another material instead of using other methods (e.g., atomic layer deposition). Using the techniques described herein can result in a more defined structures (e.g., charge storage structure and write channel region) for the described memory cells.

FIG. 20 through FIG. 26 show different views of elements during processes of forming memory device 2000, according to some embodiments described herein. The processes of forming memory device 2000 can be a variation of the processes of forming memory device 700 (FIG. 7 through FIG. 19). Thus, similar elements (which have the same labels) between the processes of forming memory devices 700 and 2000 are not repeated.

Figure 20:
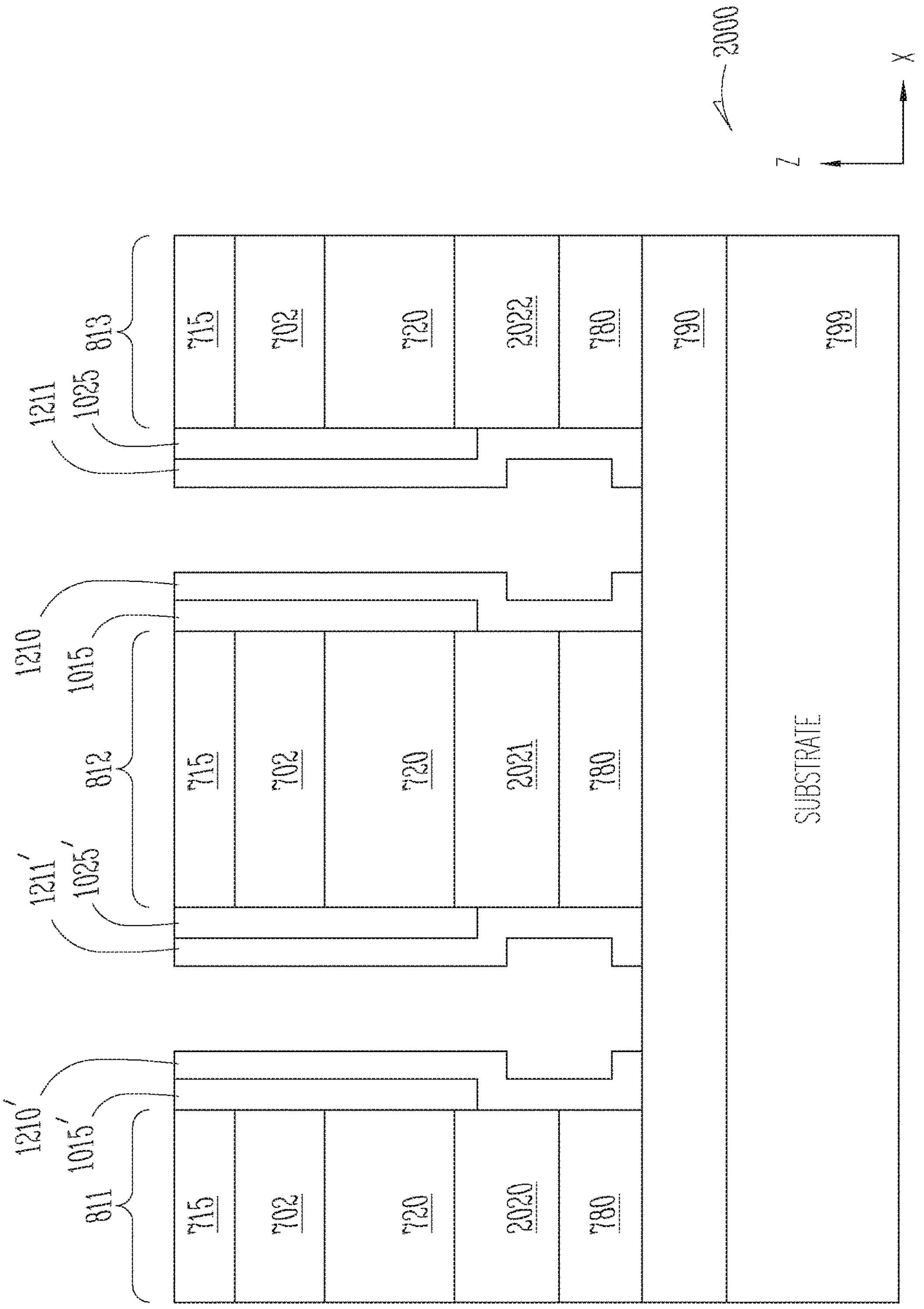

FIG. 20 shows the elements of memory device 2000 that can be formed using similar or identical processes used to the elements of memory device 700 from FIG. 7 through FIG. 12. Thus, the elements of memory device 2000 shown in FIG. 20 can be similar to the elements of memory device 700 shown in FIG. 12.

As shown in FIG. 20, memory device 2000 can include data lines 2020, 2021, and 2022 in respective structures 811, 812, and 813. Each of data lines 2020, 2021, and 2022 is formed from conductive material that can be conductive material 782 shown in FIG. 12 included in respective structure among structures 811, 812, and 813. Data lines 2020, 2021, and 2022 are electrically separated from each other. Each of data lines 2020, 2021, and 2022 can have a length (hidden from view in FIG. 20) in the Y-direction. Data lines 2021 and 2022 can correspond to data lines 221 and 222, respectively, of memory device 200 (FIG. 2 and FIG. 5).

Figure 21:
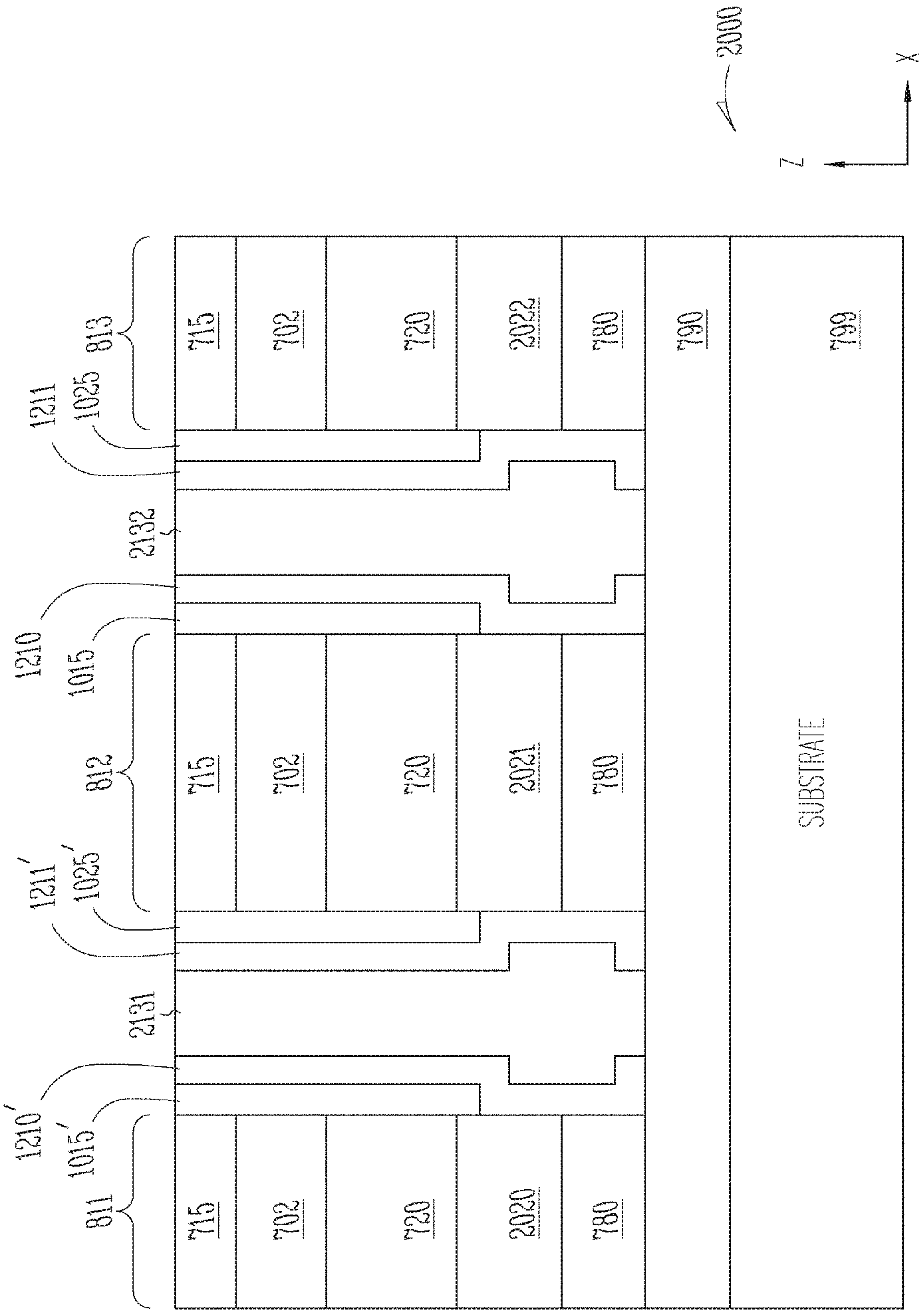

FIG. 21 shows memory device 700 after dielectric materials (dielectrics) 2131 and 2132 are formed (e.g., deposited). Dielectric material 2131 can be formed between semiconductor materials 1210' and 1211'. Dielectric material 2132 can be formed between semiconductor materials 1210 and 1211.

Figure 22:
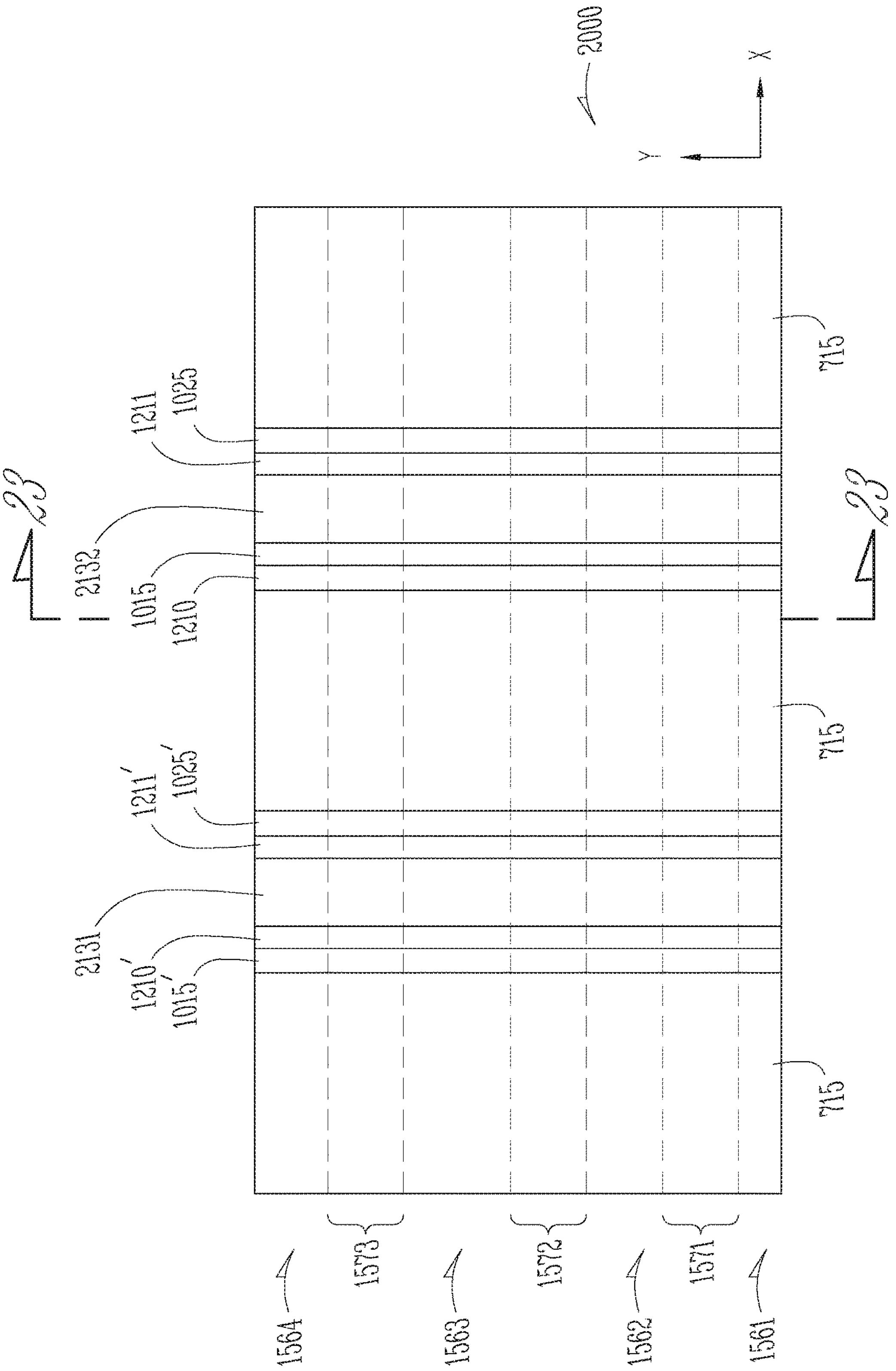
FIG. 22 through FIG. 26 show processes of forming another memory device, according to some embodiments described herein.

FIG. 22 shows a top view of memory device 2000 with respect to the X-Y directions of memory device 2000 of FIG. 21. Subsequent processes of forming memory device 2000 can include removing (e.g., cutting (e.g., etching) in the Z-direction) the materials at locations 1561-1564 down to (stopping at) data lines 2020, 2021, and 2022 (FIG. 21). This way, each of data lines 2020, 2021, and 2022 (which have length extending in the Y-direction) can remain extending continuously in the Y-direction and electrically coupled to memory cells (e.g., in column) in the Y direction. A view along line 22-22 of memory device 2000 after the materials at locations 1561-1564 is shown in FIG. 23.

Figure 23:
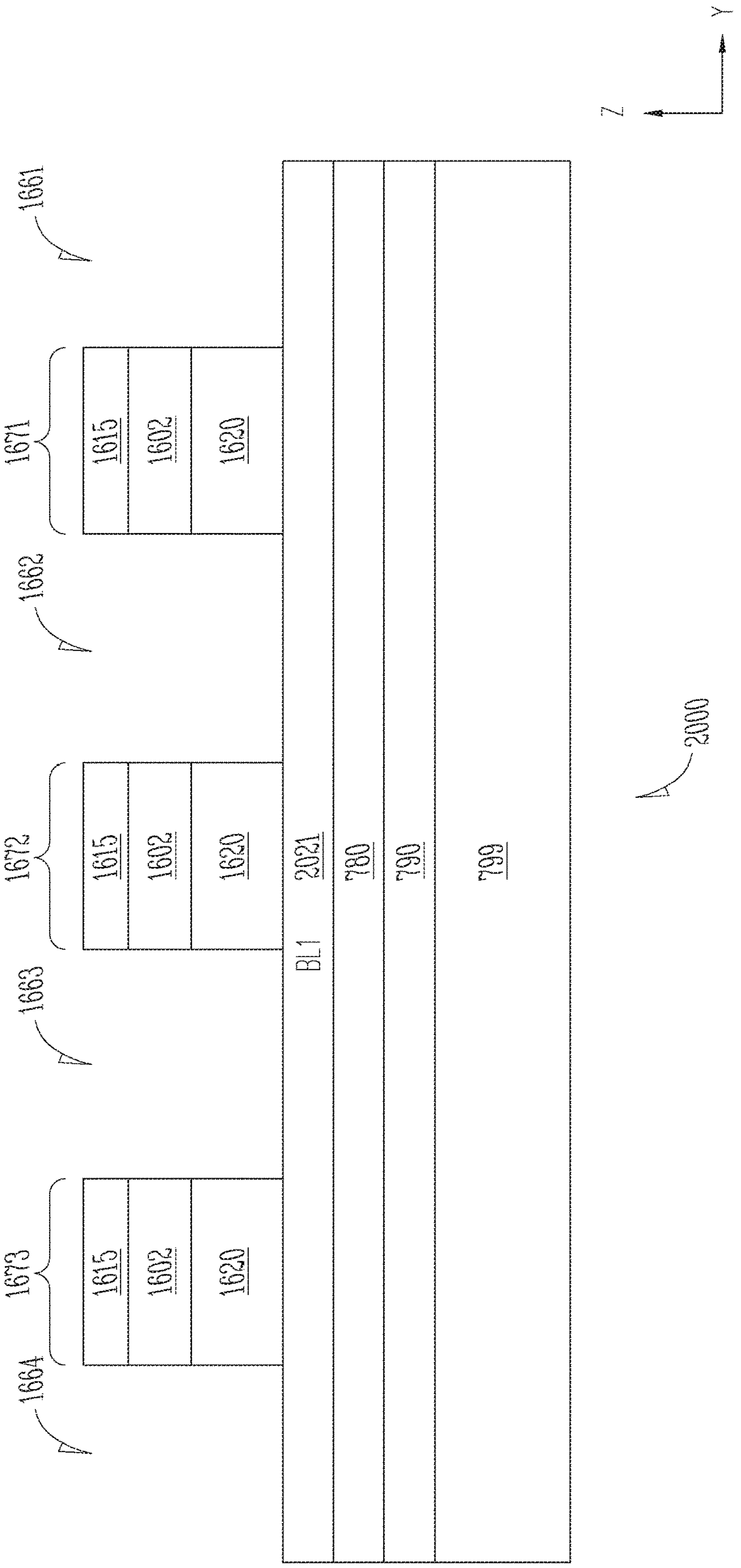

FIG. 23 shows a side view along line 23-23 of FIG. 22 with respect to the Y-Z directions after trenches 1661-1664 are formed at locations 1561-1564 (FIG. 22), respectively. As shown in FIG. 23, the materials at trenches 1661-1664 were removed, stopping at (e.g., down to) data line 2021 (and also stopping at data lines 2020 and 2022 (FIG. 20), not shown in FIG. 23). Trenches 1661-1664 can be formed by removing part of each of the materials (including dielectric material 715, material 702 (under material 715 in FIG. 22, and material 720 under material 702 in FIG. 22) at locations 1561-1564 (as mentioned above). In FIG. 23, portions 1615, 1602, and 1620 at each of structures (e.g., device structures) 1671, 1672, and 1673 are remaining part dielectric material 715, material 702, and material 720, respectively (FIG. 22) after trenches 1661-1664 are formed. Each of structures 1671, 1672, and 1673 can be part of a memory cell in subsequent processes of forming memory device 700.

Figure 24:
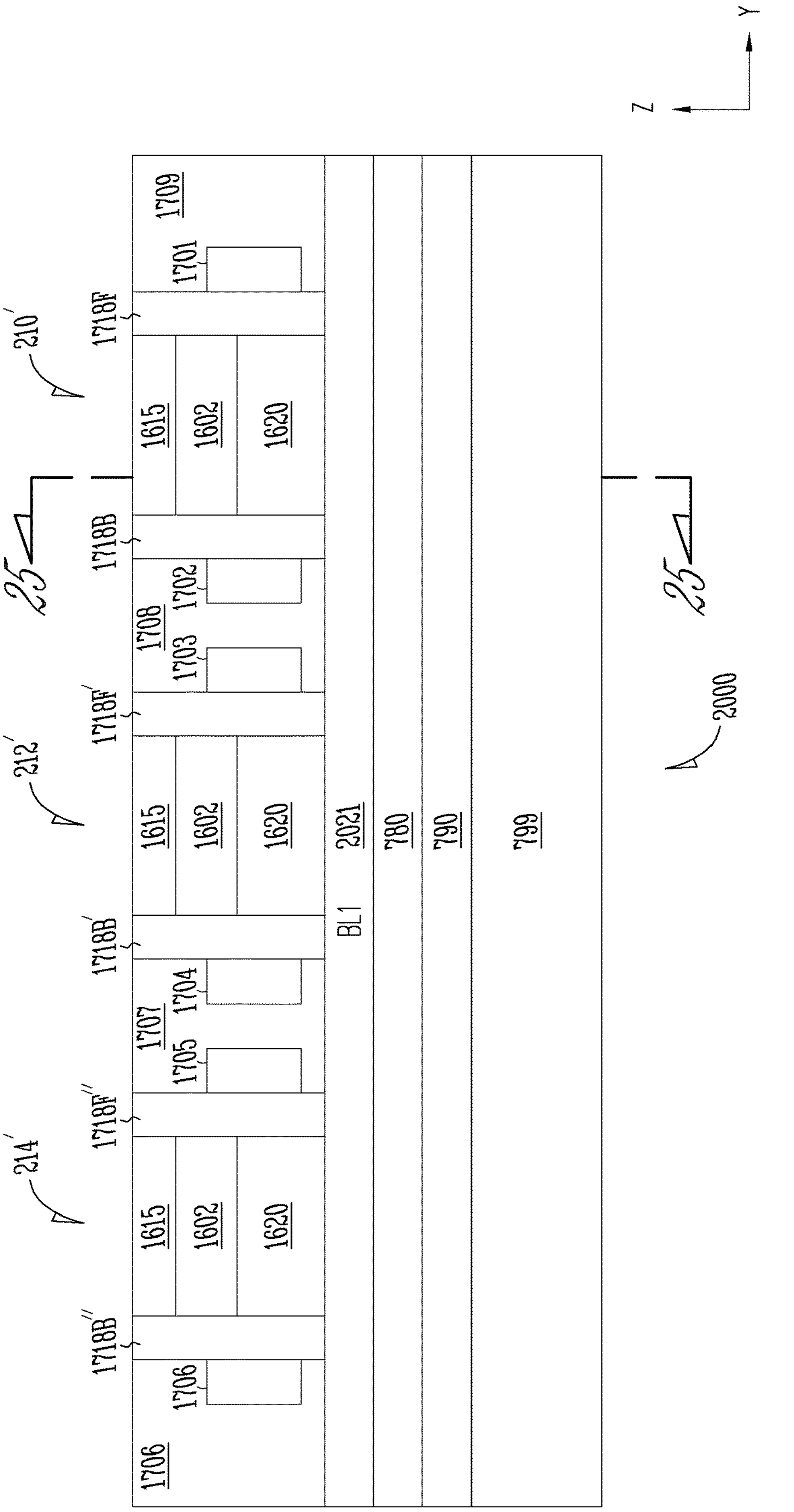

FIG. 24 shows memory device 2000 after dielectric materials (e.g., gate oxides) 1718B, 1718F, 1718B', 1718F', 1718B", and 1718F", conductive lines (e.g., conductive regions) 1701, 1702, 1703, 1704, 1705, and 1706 (1701-1706), and dielectric materials 1706, 1707, 1708, and 1709 (1706-1709) are formed in respective trenches 1661-1664 (labeled in FIG. 23). Conductive lines 1701-1706 can form part of access lines (e.g., word lines) to access memory cells 210', 212' and 214' of memory device 2000. Memory cells 210', 212', and 214' can correspond to memory cells 210, 212, and 214, respectively, of memory device 200 of FIG. 2. Another view of memory device 2000 along line 25-25 is shown in FIG. 25.

Figure 25:
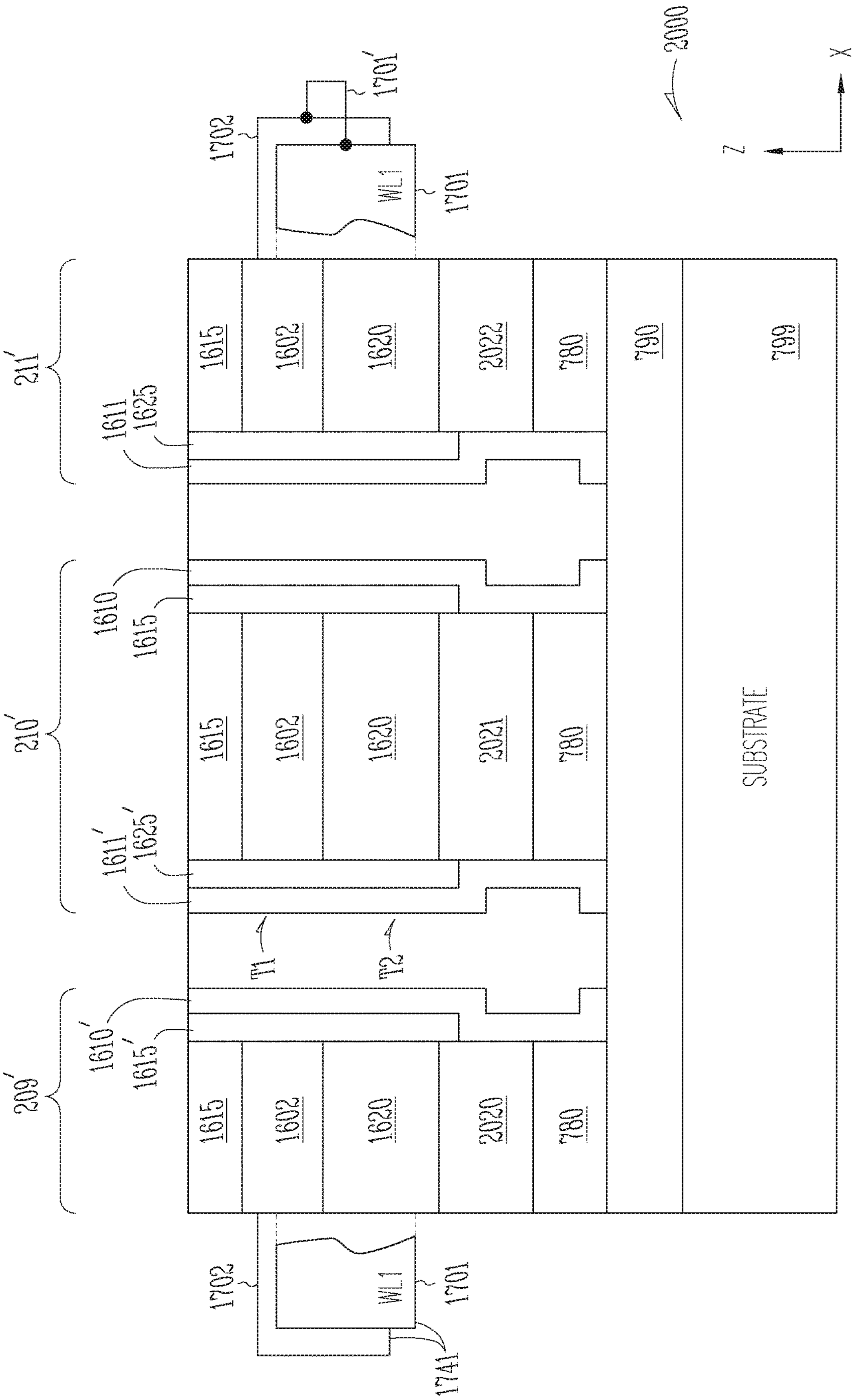

FIG. 25 shows a side view along line 25-25 of FIG. 24 with respect to the X-Z directions. In FIG. 25, conductive lines 1701 and 1702 are partially shown to avoid obstructing some parts of the other the elements of memory device 2000. Conductive lines 1701 and 1702 can be electrically coupled to each other through conductive connection 1701' (as described above with reference to FIG. 17 and FIG. 18).

In FIG. 25, each of portions 1602 can form the charge storage structure (e.g., memory element) of a respective memory cell among memory cells 209', 210', and 211'. Each of memory cells 209', 210', and 211' can have transistors T1 and T2 similar to transistors T1 and T2 of memory device 200 of FIG. 5. For simplicity, transistors T1 and T2 of only memory cell 210' is labeled in FIG. 25.

Each of portions 1620 can form part of a channel region (e.g., write channel region) of a transistor T2 of a respective memory cell among memory cells 209', 210', and 211'. For example, portion 1620 above data line 2021 can form part of a channel region (e.g., write channel region) of a transistor T2 of memory cell 210'.

The combination of portions 1610 and 1611' (e.g., two semiconductor portions) can form part of a channel region (e.g., read channel region) of transistor T1 of memory cell 210'. Each of memory cells 209' and 211' of memory device 200 can also include two semiconductor portions that can form a channel region (e.g., read channel region) of transistor T1 of the memory cell. However, only one of two semiconductor portions of transistor T1 (not labeled) of each of memory cells 209' and 211' is shown in FIG. 25. For example, FIG. 25 shows portion 1610' that can form part of a channel region of transistor T1 of memory cell 209', and portion 1611 that can form part of a channel region of transistor T1 of memory cell 211'.

Thus, each of the memory cells of memory device 2000 in FIG. 25 can have two separate semiconductor portions (e.g., portions 1610 and 1611' of memory cell 210' of FIG. 25) that form a channel region (e.g., read channel region) in the respective memory cell. In comparison with memory device 700 shown in FIG. 18, each of the memory cells of memory device 700 can have one (e.g., a single) semiconductor portion (e.g., portion 1610 of memory cell 210' of FIG. 18) that forms a channel region (e.g., read channel region) the respective memory cell.

In FIG. 25, conductive lines 1701 and 1702 can be part of an access line (e.g., word line) 1741 (which can receive a signal (e.g., word line signal) WL1 to access memory cell 209', 210', and 211' during an operation of memory device 700. Access line 1741 can correspond to access line 241 of memory device 200 of FIG. 2. As shown in FIG. 25, part of conductive line 1701 can span across (e.g., overlap in the X-direction) part of portions 1610 and 1611' and part of portion 1620 of memory cell 210'. Thus, as shown in FIG. 25, part of conductive line 1701 can span across (e.g., overlap) part of (e.g., on a side (e.g., front side) in the Y-direction) both read and write channel regions of transistors T1 and T2, respectively, of memory cell 210'. Part of conductive line 1702 can span across (e.g., overlap in the X-direction) part of (e.g., on another side (e.g., back side opposite from the front side) in the Y-direction) portions 1610 and 1611' and part of portion 1620 (e.g., read and write channel regions of transistors T1 and T2, respectively) of memory cell 210'. Similarly, part of each of conductive lines 1701 and 1702 can span across part of a read channel region and part of write channel region of each of memory cell 209' and 211'.

Figure 26:
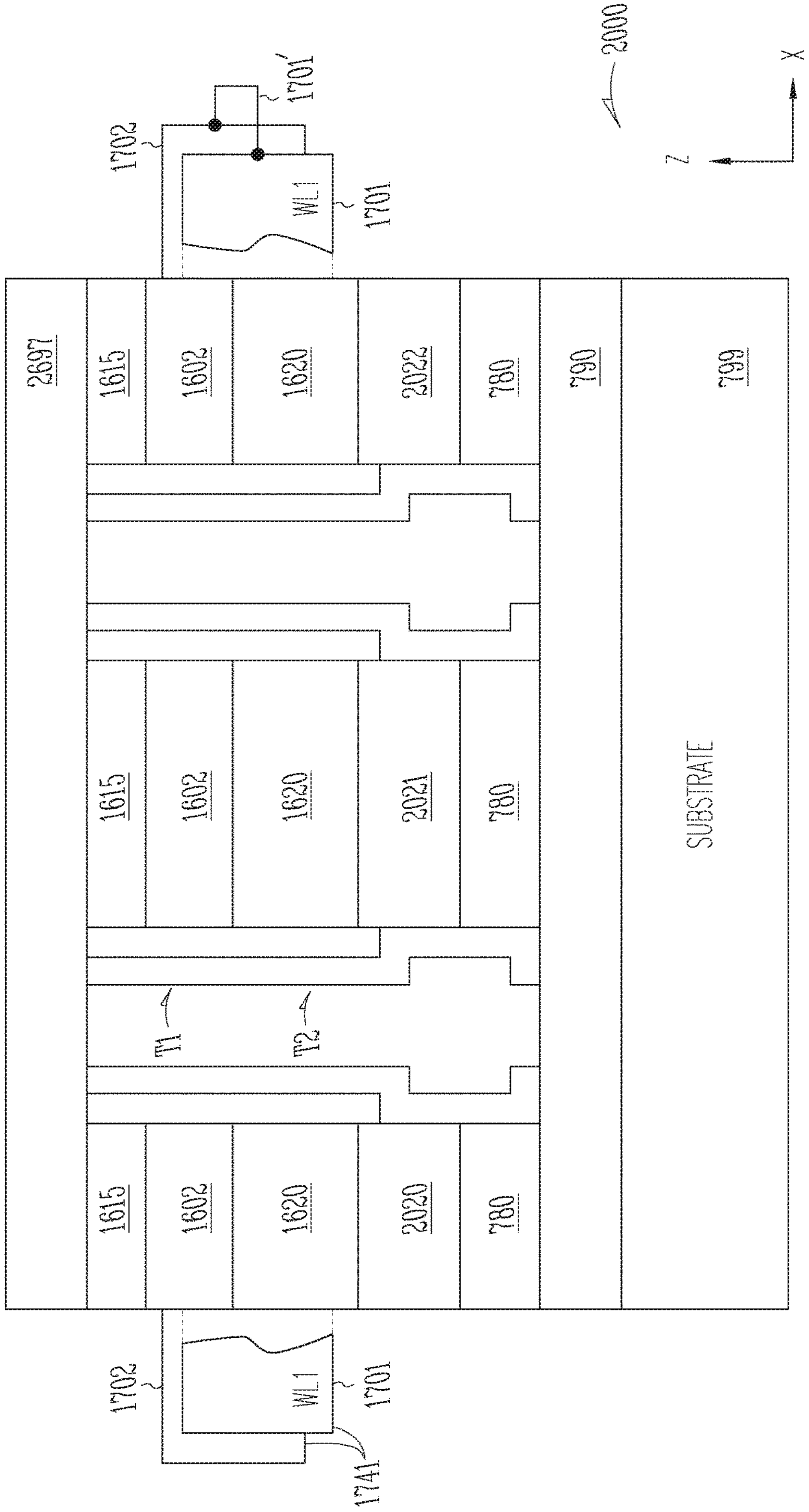

FIG. 26 shows memory device 2000 after a conductive plate 2697 is formed (e.g., deposited) over other elements (e.g., memory cells 209', 210', and 211') of memory device 2000. Conductive plate 2697 can correspond to conductive plate 1997 of FIG. 19. As shown in FIG. 26, conductive plate 2697 can contact (e.g., electrically couple to) portions (e.g., read channel region) 1610 and 1611' (e.g., labeled in FIG. 25) of memory cell 210', portion (e.g., part of read channel region) 1610' (e.g., labeled in FIG. 25) of memory cell 209', and portion (e.g., part of read channel region) 1611 (e.g., labeled in FIG. 25).

The description of forming memory device 2000 with reference to FIG. 20 through FIG. 26 can include other processes to form a complete memory device. Such processes are omitted from the above description so as to not obscure the subject matter described herein.

Figure 27A:
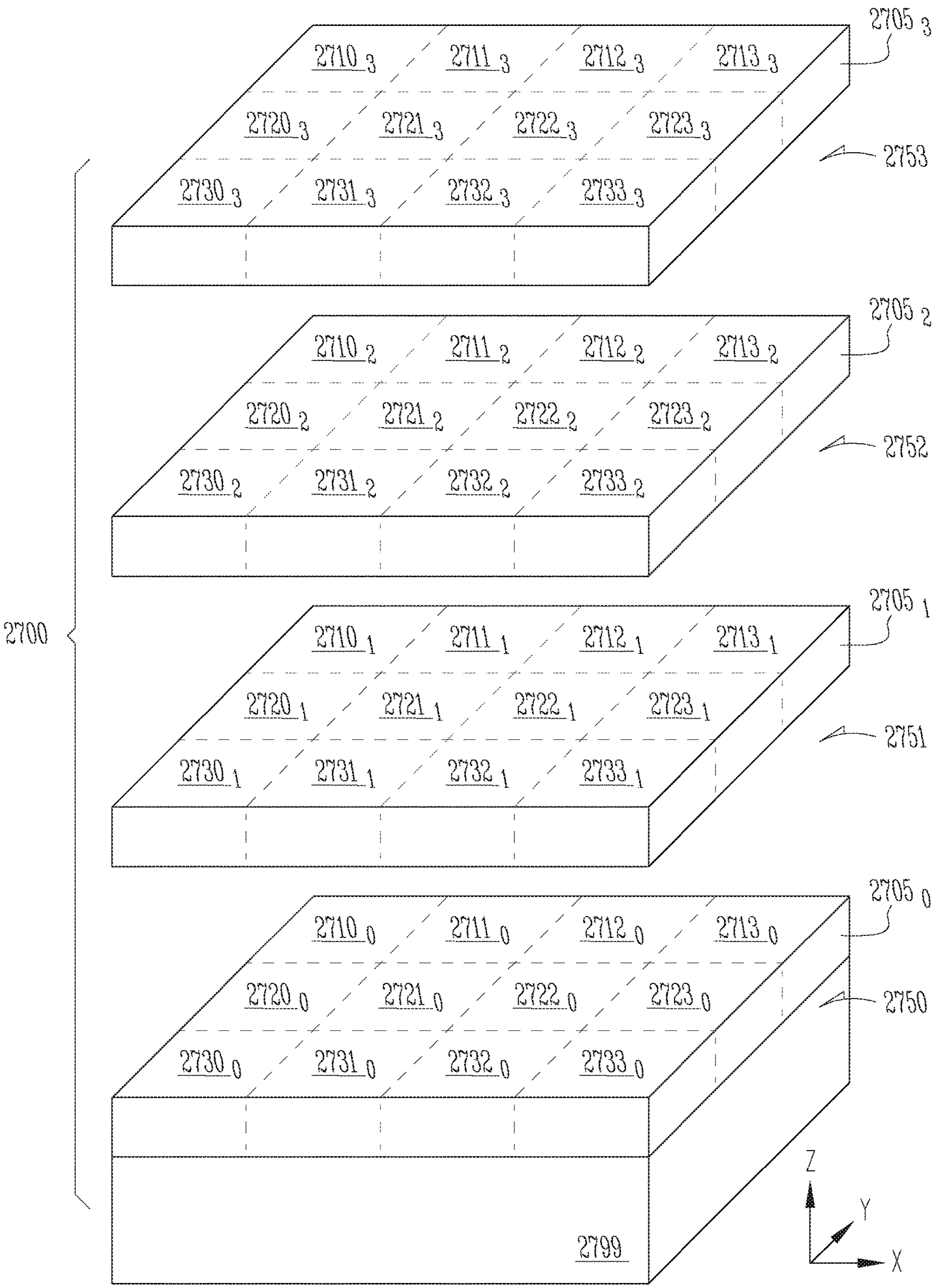
FIG. 27A, FIG. 27B, and FIG. 27C show different views of a structure of a memory device including multiple decks of memory cells, according to some embodiments described herein.
Figure 27B:
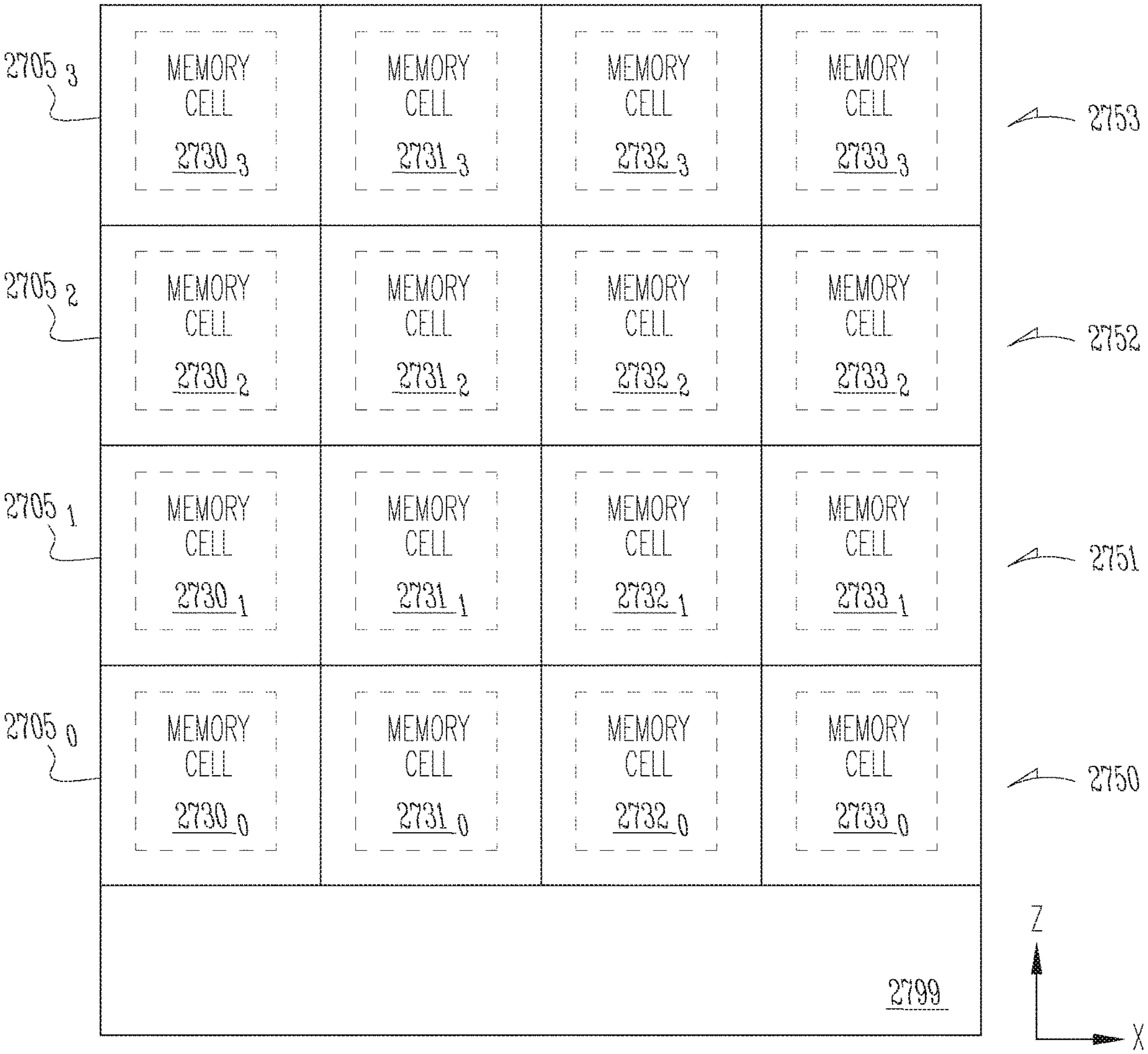
Figure 27C:
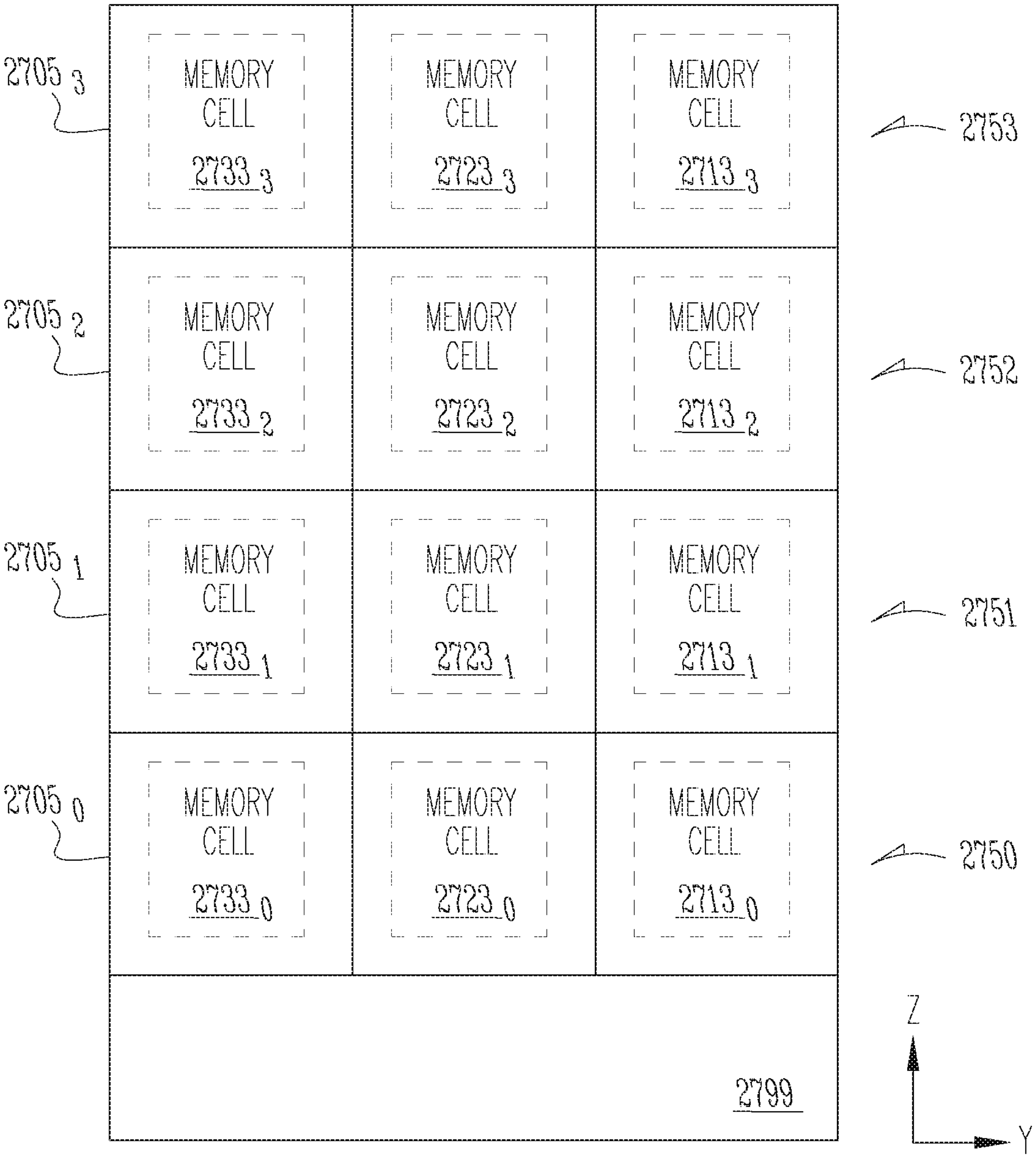

FIG. 27A, FIG. 27B, and FIG. 27C show different views of a structure of a memory device 2700 including multiple decks of memory cells, according to some embodiments described herein. FIG. 27A shows an exploded view (e.g., in the Z-direction) of memory device 2700. FIG. 27B shows a side view (e.g., cross-sectional view) in the X-direction and the Z-direction of memory device 270. FIG. 27C shows a side view (e.g., cross-sectional view) in the Y-direction and the Z-direction of memory device 2700.

As shown in FIG. 27A memory device 2700 can include decks (decks of memory cells) $\mathbf{2705_0}$, $\mathbf{2705_1}$, $\mathbf{2705_2}$, and $\mathbf{2705_3}$ that are shown separately from each other in an exploded view to help ease of viewing the deck structure of memory device 2700. In reality, decks $\mathbf{2705_0}$, $\mathbf{2705_1}$, $\mathbf{2705_2}$, and $\mathbf{2705_3}$ can be attached to each other in an arrangement where one deck can be formed (e.g., stacked) over another deck over a substrate (e.g., a semiconductor (e.g., silicon) substrate) 2799. For example, as shown in FIG. 27A, decks $\mathbf{2705_0}$, $\mathbf{2705_1}$, $\mathbf{2705_2}$, and $\mathbf{2705_3}$ can be formed in the Z-direction perpendicular to substrate 2799 (e.g., formed vertically in the Z-direction with respect to substrate 2799).

As shown in FIG. 27A, each of decks $\mathbf{2705_0}$, $\mathbf{2705_1}$, $\mathbf{2705_2}$, and $\mathbf{2705_3}$ can have memory cells arranged in the X-direction and the Y-direction (e.g., arranged in rows in the X-direction and in columns in the Y-direction). For example, deck $\mathbf{2705_0}$ can include memory cells $\mathbf{2710_0}$, $\mathbf{2711_0}$, $\mathbf{2712_0}$, and $\mathbf{2713_0}$ (e.g., arranged in a row), memory cells $\mathbf{2720_0}$, $\mathbf{2721_0}$, $\mathbf{2722_0}$, and $\mathbf{2723_0}$ (e.g., arranged in a row), and memory cells $\mathbf{2730_0}$, $\mathbf{2731_0}$, $\mathbf{2732_0}$, and $\mathbf{2733_0}$ (e.g., arranged in a row).

Deck $\mathbf{2705_1}$ can include memory cells $\mathbf{2710_1}$, $\mathbf{2711_1}$, $\mathbf{2712_1}$, and $\mathbf{2713_1}$ (e.g., arranged in a row), memory cells $\mathbf{2720_1}$, $\mathbf{2721_1}$, $\mathbf{2722_1}$, and $\mathbf{2723_1}$ (e.g., arranged in a row), and memory cells $\mathbf{2730_1}$, $\mathbf{2731_1}$, $\mathbf{2732_1}$, and $\mathbf{2733_1}$ (e.g., arranged in a row).

Deck $\mathbf{2705_2}$ can include memory cells $\mathbf{2710_2}$, $\mathbf{2711_2}$, $\mathbf{2712_2}$, and $\mathbf{2713_2}$ (e.g., arranged in a row), memory cells $\mathbf{2720_2}$, $\mathbf{2721_2}$, $\mathbf{2722_2}$, and $\mathbf{2723_2}$ (e.g., arranged in a row), and memory cells $\mathbf{2730_2}$, $\mathbf{2731_2}$, $\mathbf{2732_2}$, and $\mathbf{2733_2}$ (e.g., arranged in a row).

Deck $\mathbf{2705_3}$ can include memory cells $\mathbf{2710_3}$, $\mathbf{2711_3}$, $\mathbf{2712_3}$, and $\mathbf{2713_3}$ (e.g., arranged in a row), memory cells $\mathbf{2720_3}$, $\mathbf{2721_3}$, $\mathbf{2722_3}$, and $\mathbf{2723_3}$ (e.g., arranged in a row), and memory cells $\mathbf{2730_3}$, $\mathbf{2731_3}$, $\mathbf{2732_3}$, and $\mathbf{2733_3}$ (e.g., arranged in a row).

As shown in FIG. 27A, decks $\mathbf{2705_0}$, $\mathbf{2705_1}$, $\mathbf{2705_2}$, and $\mathbf{2705_3}$ can be located (e.g., formed vertically in the Z-direction) on levels (e.g., portions) 2750, 2751, 2752, and 2753, respectively, of memory device 2700. The arrangement of decks $\mathbf{2705_0}$, $\mathbf{2705_1}$, $\mathbf{2705_2}$, and $\mathbf{2705_3}$ forms a 3-dimensional (3-D) structure of memory cells of memory device 2700 in that different levels of the memory cells of memory device 2700 can be located (e.g., formed) in different levels (e.g., different vertical portions) 2750, 2751, 2752, and 2753 of memory device 2700.

Decks $\mathbf{2705_0}$, $\mathbf{2705_1}$, $\mathbf{2705_2}$, and $\mathbf{2705_3}$ can be formed one deck at a time. For example, decks $\mathbf{2705_0}$, $\mathbf{2705_1}$, $\mathbf{2705_2}$, and $\mathbf{2705_3}$ can be formed sequentially in the order of decks $\mathbf{2705_0}$, $\mathbf{2705_1}$, $\mathbf{2705_2}$, and $\mathbf{2705_3}$ (e.g., deck $\mathbf{2705_1}$ is formed first and deck $\mathbf{2705_3}$ is formed last). In this example, the memory cell of one deck (e.g., deck $\mathbf{2705_1}$) can be formed either after formation of the memory cells of another deck (e.g., deck $\mathbf{2705_0}$) or before formation of the memory cells of another deck (e.g., deck $\mathbf{2705_2}$). Alternatively, decks $\mathbf{2705_0}$, $\mathbf{2705_1}$, $\mathbf{2705_2}$, and $\mathbf{2705_3}$ can be formed concurrently (e.g., simultaneously), such that the memory cells of decks $\mathbf{2705_0}$, $\mathbf{2705_1}$, $\mathbf{2705_2}$, and $\mathbf{2705_3}$ can be concurrently formed. For example, the memory cells in levels 2750, 2751, 2752, and 2753 of memory device 2700 can be concurrently formed.

The structures of the memory cells of each of decks $\mathbf{2705_0}$, $\mathbf{2705_1}$, $\mathbf{2705_2}$, and $\mathbf{2705_3}$ can include the structures of the memory cells described above with reference to FIG. 1 through FIG. 28. For example, the structures of the of the memory cells of decks $2705_0$, $2705_1$, $2705_2$, and $2705_3$ can include the structure of the memory cells of memory devices 200, 700, and 2000.

Memory device 2700 can include data lines (e.g., bit lines) and access lines (e.g., word lines) to access the memory cells of decks $2705_0$, $2705_1$, $2705_2$, and $2705_3$. For simplicity, data lines and access lines of memory cells are omitted from FIG. 27A. However, the data lines and access lines of memory device 2700 can be similar to the data lines and access lines, respectively, of the memory devices described above with reference to FIG. 1 through FIG. 26.

FIG. 27A shows memory device 2700 including four decks (e.g., $2705_0$, $2705_1$, $2705_2$, and $2705_3$) as an example. However, the number of decks can be different from four. FIG. 27A shows each of decks $2705_0$, $2705_1$, $2705_2$, and $2705_3$ including one level (e.g., layer) of memory cells as an example. However, at least one of the decks (e.g., one or more of decks $2705_0$, $2705_1$, $2705_2$, and $2705_3$) can have two (or more) levels of memory cells. FIG. 27A shows an example where each of decks $2705_0$, $2705_1$, $2705_2$, and $2705_3$ includes four memory cells (e.g., in a row) in the X-direction and three memory cells (e.g., in a column) in the Y-direction. However, the number of memory cells in a row, in a column, or both, can vary.

The illustrations of apparatuses (e.g., memory devices 100, 200, 700, 2000, and 2700) and methods (e.g., operations of memory devices 100 and 200, and methods of forming memory devices 700 and 2000) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 700, 2000, and 2700) or a system (e.g., an electronic item that can include any of memory devices 100, 200, 700, 2000, and 2700).

Any of the components described above with reference to FIG. 1 through FIG. 27C can be implemented in a number of ways, including simulation via software. Thus, apparatuses (e.g., memory devices 100, 200, 700, 2000, and 2700) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 700, 2000, and 2700) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 27C include apparatuses and methods of forming the apparatuses. One of the apparatuses includes a substrate, a conductive plate located over the substrate to couple a ground connection, a data line located between the substrate and the conductive plate, a memory cell, and a conductive line. The memory cell includes a first transistor and a second transistor. The first transistor includes a first region electrically coupled between the data line and the conductive plate, and a charge storage structure electrically separated from the first region. The second transistor includes a second region electrically coupled to the charge storage structure and the data line. The conductive line is electrically separated from the first and second regions and spans across part of the first region of the first transistor and part of the second region of the second transistor and forming a gate of the first and second transistors. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A method comprising:

forming data lines;

forming memory cells after the data lines are formed, such that each of the memory cells includes a first transistor and a second transistor, the first transistor includes a charge storage structure located over a data line of the data lines, and a first channel region contacting the data line, the second transistor includes a second channel region between the charge storage structure and the data line; and forming a ground plate over the memory cells after the data lines are formed, the ground plate contacting the first channel region of the first transistor of each of the memory cells.

2. The method of claim 1, wherein forming the memory cells includes:

forming levels of materials over a substrate;

forming trenches in the levels of materials, such that each of the trenches includes a length in a first direction, a side wall formed by a portion of a remaining part of each of the levels of materials, and the side wall includes a side wall portion formed by a portion of a respective data line among the data lines; and forming the first channel region of each of the memory cell of the memory cells in a respective trench of the first trenches, such that the first channel region contacts the side wall portion of the side wall a respective trench of the trenches.

3. The method of claim 2, further comprising:

forming additional trenches in the remaining part of each of the levels of materials, such that each of the additional trenches includes a length in a second direction; and forming conductive lines in the additional trenches, such that each of the conductive lines is formed in a respective trench of the additional trenches.

4. A method comprising:

forming data lines over a substrate;

forming memory cells over the substrate, such that each of the memory cells includes a first transistor and a second transistor, the first transistor includes a charge storage structure located over a data line of the data lines, and a first channel region contacting the data line, the second transistor includes a second channel region between the charge storage structure and the data line;

forming conductive lines such that each of the conductive lines is electrically separated from the first and second channel region of a respective memory cell of the memory cells, and such that part of each of the conductive lines spans across part of each of the first and second channel regions of a respective memory cell of the memory cells; and forming a ground plate over the conductive lines and contacting the first channel region of the first transistor of each of the memory cells.

5. The method of claim 4, wherein forming the memory cells includes:

forming levels of materials over the substrate;

forming trenches in the levels of materials, such that each of the trenches includes a length in a first direction, a side wall formed by a portion of a remaining part of each of the levels of materials, and the side wall includes a side wall portion formed by a portion of a respective data line among the data lines; and forming the first channel region of each of the memory cell of the memory cells in a respective trench of the first trenches, such that the first channel region contacts the side wall portion of the side wall a respective trench of the trenches.

6. The method of claim 5, wherein forming the conductive lines includes:

forming additional trenches in the remaining part of each of the levels of materials, such that each of the additional trenches includes a length in a second direction; and forming the conductive lines in the additional trenches, such that each of the conductive lines is formed in a respective trench of the additional trenches.

7. The method of claim 5, wherein forming the levels of materials over the substrate includes:

forming a first semiconductor material;

forming a conductive material over the first semiconductor material;

forming a second semiconductor material over the conductive material; and forming a charge storage material over the additional semiconductor material.

8. The method of claim 7, wherein forming the data lines includes:

removing a portion of the conductive material at locations of the trenches when the trenches are formed to form the data lines from a remaining portion of the conductive material.

9. The method of claim 7, wherein forming the memory cells includes:

removing a portion of the second semiconductor material at locations of the trenches when the trenches are formed to form the second channel region of each of the memory cells from a remaining portion of the second semiconductor material; and removing a portion of the charge storage material at locations of the trenches when the trenches are formed to form the charge storage structure of each of the memory cells from a remaining portion of the charge storage material.

10. The method of claim 7, wherein the second semiconductor material comprises a semiconducting oxide material.

11. A method comprising:

forming levels of materials over a substrate;

forming first trenches in the levels of materials by removing part of the levels of materials, such that each of the first trenches includes a length in a first direction, a first side wall formed by a first portion of a remaining part of each of the levels of materials, and a second side wall formed by a second portion of the remaining part of each of the levels of materials;

forming a first dielectric on a first portion of the first side wall of each of the first trenches;

forming a first additional dielectric on a first portion of the second side wall of each of the first trenches;

forming a first semiconductor material adjacent the first dielectric and contacting a second portion of the first side wall of each of the first trenches;

forming a first additional semiconductor material adjacent the first additional dielectric and contacting a second portion of the second side wall of each of the first trenches;

forming a second dielectric between the first semiconductor material and the first additional semiconductor material in each of the first trenches; and forming second trenches in a second direction by removing a portion of the remaining part of each of the levels of materials, a portion of each of the first dielectric, a portion of the first additional dielectric, a portion of the second dielectric, a portion of the semiconductor material, and a portion of the additional material to form memory cells, such that a first memory cell of the memory cells includes at least part of a remaining portion of the semiconductor material, and a second memory cell of the memory cells includes at least part of a remaining portion of the additional semiconductor material.

12. The method of claim 11, wherein forming the levels of materials over the substrate includes:

forming a semiconductor material;

forming a conductive material over the semiconductor material;

forming an additional semiconductor material over the conductive material; and forming a charge storage material over the additional semiconductor material.

13. The method of claim 12, wherein the semiconductor material has a p-type conductivity.

14. The method of claim 12, wherein the additional semiconductor material comprises a semiconducting oxide material.

15. The method of claim 12, wherein the additional semiconductor material comprises at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

16. The method of claim 12, wherein the second portion of the first side wall is formed from a first portion of the conductive material, and the second portion of the second side wall is formed from a second portion of the conductive material.

17. The method of claim 12, wherein:

the first memory cell includes a charge storage structure formed from one of the levels of materials adjacent the first portion of the first side wall of a trench of the first trenches; and the second memory cell includes a charge storage structure formed from one of the levels of materials adjacent the first portion of the second side wall of the trench of the first trenches.

18. The method of claim 12, further comprising:

forming a conductive plate contacting the remaining part of the semiconductor material and the remaining part of the additional semiconductor.

19. The method of claim 12, further comprising:

forming a conductive line in each of the second trenches, such that the conductive line has a length in the second direction, and the conductive line is electrically separated from the memory cells.

20. The method of claim 12, further comprising:

forming an additional conductive line in each of the second trenches, such that the additional conductive line has a length in the second direction, and the additional conductive line is electrically separated from the memory cells.

* * * * *